United States Patent
Walther et al.

(10) Patent No.: US 8,847,589 B2
(45) Date of Patent: Sep. 30, 2014

(54) MAGNETIC FIELD SENSOR WITH SUSPENDED STRESS GAUGE

(75) Inventors: Arnaud Walther, Grenoble (FR); Philippe Robert, Grenoble (FR); Olivier Redon, Seyssinet Pariset (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 488 days.

(21) Appl. No.: 13/145,885

(22) PCT Filed: Jan. 22, 2010

(86) PCT No.: PCT/EP2010/050710
§ 371 (c)(1),
(2), (4) Date: Aug. 31, 2011

(87) PCT Pub. No.: WO2010/084165
PCT Pub. Date: Jul. 29, 2010

(65) Prior Publication Data
US 2011/0304325 A1      Dec. 15, 2011

(30) Foreign Application Priority Data
Jan. 26, 2009   (FR) ...................................... 09 50463

(51) Int. Cl.
| | | |
|---|---|---|
| *G01R 33/02* | (2006.01) | |
| *G01R 33/022* | (2006.01) | |
| *G01R 33/028* | (2006.01) | |
| *G01R 33/038* | (2006.01) | |

(52) U.S. Cl.
CPC .......... *G01R 33/022* (2013.01); *G01R 33/0286* (2013.01); *G01R 33/0283* (2013.01); *G01R 33/038* (2013.01); *Y10S 977/707* (2013.01)
USPC ......... 324/246; 324/249; 310/12.03; 977/707

(58) Field of Classification Search
None
See application file for complete search history.

(56) References Cited

U.S. PATENT DOCUMENTS 4,680,544 A * 7/1987 Rudolf .......................... 324/259
6,501,268 B1 * 12/2002 Edelstein et al. ............. 324/244
(Continued)

FOREIGN PATENT DOCUMENTS

WO    WO 01/67122 A2    9/2001
WO    WO 2007/126164 A1    11/2007

OTHER PUBLICATIONS

Liu et al. "Micromachined Magnetic Actuators Using Electroplated Permalloy", May 1999, IEEE Trans. On Magnetics, vol. 35, No. 3, pp. 1976-1985.*

(Continued)

*Primary Examiner* — Melissa Koval
*Assistant Examiner* — Courtney McDonnough
(74) *Attorney, Agent, or Firm* — Oblon, Spivak, McClelland, Maier & Neustadt, L.L.P.

(57) ABSTRACT

A magnetic field sensor including a body including a magnetic mechanism capable of forming a torque applied on the body by action of an external magnetic field to be detected; a connector, separated from the body, mechanically connecting the body to an inlay portion of the sensor by at least one pivot link having an axis perpendicular to the direction of the magnetic field to be detected; a detector detecting stress applied by the body by action of the torque, separated from the connector and including at least one suspended stress gauge including a first part mechanically connected to the inlay portion, a second part mechanically connected to the body, and a third part provided between the first and second parts and suspended between the inlay portion and the body.

27 Claims, 17 Drawing Sheets

(56) References Cited

U.S. PATENT DOCUMENTS

| | | | |
|---|---|---|---|
| 7,358,722 B2 | 4/2008 | Peczalski et al. | |
| 2003/0020472 A1 | 1/2003 | Kretschmann et al. | |
| 2004/0012895 A1* | 1/2004 | Drewes et al. | 360/324.1 |
| 2006/0076947 A1 | 4/2006 | Berkcan et al. | |
| 2007/0209437 A1* | 9/2007 | Xue et al. | 73/514.31 |
| 2007/0222011 A1 | 9/2007 | Robert et al. | |
| 2008/0070338 A1 | 3/2008 | Zribi et al. | |
| 2008/0122431 A1* | 5/2008 | Berkcan et al. | 324/126 |
| 2008/0314148 A1* | 12/2008 | Robert | 73/514.33 |
| 2008/0316655 A1* | 12/2008 | Shoji | 360/324.1 |
| 2010/0186510 A1* | 7/2010 | Robert | 73/514.29 |

OTHER PUBLICATIONS

Stemme G., Journal of Micromechanics and Microengineering, 1991, J. Micromech. Microeng., vol. 1 No. 2, p. 113-125.*

French Preliminary Search Report issued Dec. 21, 2009, in Patent Application No. FR 0950463. (with English Translation of Category).

P. Poulichet. "Magnetic Sensors and Magnetic Actuators", Feb. 2005, pp. 1-26.

* cited by examiner

MAGNETIC FIELD SENSOR WITH SUSPENDED STRESS GAUGE

TECHNICAL FIELD

The invention relates to the field of magnetic sensors, and more particularly devices and methods for measuring mono- or multi-axis magnetic fields, using a MEMS or NEMS miniature sensor.

The targeted applications are for example measuring the geomagnetic fields to reconstitute an orientation (compass-type application), but also all applications that use a magnetic measuring field (remote current measurement, for example).

BACKGROUND OF THE INVENTION

Many technologies, based on different physics principles, have been developed to perform a magnetic field measurement using a miniature sensor. Examples in particular include Hall effect sensors, GMR (giant magnetoresistance) sensors, AMR (anisotropic magnetoresistance) sensors, fluxgate or magnetometric sensors, Lorentz force sensors, or magnetic material sensors.

One of the problems frequently encountered concerns the production of a sensor able to perform a magnetic field measurement along several axes. Sensors measuring the components of a magnetic field along two axes located in the plane of the sensor have already been made. But when one wishes also to measure the vertical component of the magnetic field (component perpendicular to the plane of the sensor), the production of such a sensor becomes much more complex, in particular if one wishes for this sensor also to measure magnetic components of the magnetic field located in the plane of the sensor.

Moreover, certain types of sensors are not adapted to perform certain magnetic field measurements. For example, to perform a measurement of the geomagnetic field, Hall effect sensors have resolutions much too low to precisely determine the direction of this magnetic field. GMR sensors have a hysteresis and perform a low-field non-linear measurement (less than about 100 μT) incompatible with a measurement of the geomagnetic field (equal to about 50 μT).

Other types of sensors also have substantial electricity consumption, such as AMR and fluxgate sensors for example, which can be a drawback, for example when these sensors are intended to be used in onboard applications.

Lorentz force sensors are quite large when one wishes to perform a precise measurement of a magnetic field such as the geomagnetic field. Furthermore, their operation in resonant mode requires substantial quality factors that can only be obtained through costly vacuum packaging.

Relative to Lorentz force sensors, hard magnetic material sensors do not require current for a force or torque to be created in the presence of a magnetic field, which represents an advantage in terms of electricity consumption. However, existing magnetic material sensors have other major drawbacks: detection according to only 1 or 2 axes, non-integrated sensor, excessive sensitivity to accelerations, or excessively low magnetic field detection sensitivity.

BRIEF DESCRIPTION OF THE INVENTION

One aim of the present invention is therefore to propose a highly-integrated and compact magnetic field sensor that can be made entirely using microsystem or nanosystem technology, i.e. of the MEMS or NEMS types, allowing single-axis or multi-axis magnetic field detection, not very sensitive to accelerations and with strong magnetic sensitivity.

To that end, the invention proposes a magnetic field sensor including at least:

a body including magnetic means capable of forming a torque applied on the body by the action of an external magnetic field to be detected, connection means, separated from the body, mechanically connecting the body to an inlay portion of the sensor by at least one pivot link having an axis perpendicular to the direction of the magnetic field to be detected, means for detecting a stress applied by the body by the action of the torque, separated from the connection means and including at least one suspended stress gauge having at least a first part mechanically connected to the inlay portion, at least a second part mechanically connected to the body, as well as at least a third part provided between the first and second parts and suspended between the inlay portion and the body.

Such a device in particular makes it possible to measure components of the geomagnetic field (also at about 50 μT) with good orientation precision (typically less than about 1°). Furthermore, such a sensor can be used in a portable and autonomous application given its reduced bulk, low mass, and potentially low electricity consumption depending on the detection means used.

This device also applies to other types of magnetic field measurement, such as the measurement of a remote current.

Such a sensor has several separate parts: the body, the connection means and the detection means. In this sensor, the stress gauge is suspended between the inlay portion and the body. To that end, at least two parts (for example end parts) of the gauge are mechanically connected (for example by an inlay connection) to the inlay portion and the body. Therefore, at least one third part of the stress gauge is suspended between these two elements, this third part not being in contact with any elements of the sensor, and is in particular not in contact with the connection means.

Given that the means for detecting the magnetic field are suspended, i.e. decorrelated from the body having the magnetic means and the rest of the sensor, it is possible to optimize the different parts of the sensor, i.e. the body, the detecting means and the connection means, independently of each other. In particular, it is possible to produce these three parts so that they have different thicknesses. It is also possible to position these detection means at different locations and to choose the location of the detection means so that they can perform a good measurement of the stress applied by the body.

Furthermore, by making the stress gauge so that it is suspended between the inlay portion and the body, it is possible to make this gauge so that its section is as small as possible, which makes it possible to optimize the detection sensitivity thereof. By using a suspended stress gauge, not implanted in an element of the sensor, one avoids the appearance of leakage currents that would appear if the stress gauge was made by dopants implantation in an element of the sensor, for example on the connection means.

Furthermore, given that the measurement of the magnetic field is done by the suspended gauge, i.e. a means decorrelated from the portion sensitive to the magnetic field, i.e. the body, the structure of the sensor can intrinsically produce, as a function of the design thereof, stress amplification on the suspended gauge, thereby improving the sensitivity of the measurement done.

Also proposed is a magnetic field sensor having at least:
a body comprising magnetic means able to form a torque applied on the body by the action of an outside magnetic field to be detected,
connection means mechanically connecting the body to an inlay portion of the sensor by at least one pivot link having an axis perpendicular to the direction of the magnetic field to be detected,
means for detecting a stress applied by the body by the action of the torque, having at least one stress gauge suspended between the inlay portion and the body.

The suspended stress gauge may be arranged outside the axis of the pivot link and/or perpendicular to the axis of pivot link.

As a result, in the case of a torque having an axis perpendicular to the plane of the body, the stress gauge can preferably be offset, at least in said plane of the body, relative to the axis of the pivot link. In the case of a torque having an axis in the plane of the body, the stress gauge may preferably be arranged in at least one plane perpendicular to that of the body and offset relative to the axis of the pivot link.

The magnetic means may include a ferromagnetic material, preferably hard, whereof the direction of magnetization is perpendicular to the direction of the magnetic field to be detected and the axis of the pivot link. Such magnetic means in particular have the advantage of operating without electricity, thereby contributing to reducing the electricity consumption of the sensor.

The ferromagnetic material may for example be CoPt, or NdFeB, or SmCo. These materials in particular have the advantage of having a strong coercivity, for example greater than about 0.1 T, which means that they do not need to be re-magnetized during the lifetime of the sensor, unlike the magnetic layers present in the AMR sensors of the prior art.

In one alternative, the ferromagnetic material may be a soft ferromagnetic material, i.e. with a low coercivity, for example less than or equal to about 1 mT, and for example composed of FeNi or CoFe. The magnetization of a soft ferromagnetic material varies as a function of the external magnetic field, in particular as a function of the magnetic field to be measured. Therefore, when the magnetic means include a soft ferromagnetic material, the body comprising the magnetic means may be oblong in a direction orthogonal to the direction of the magnetic field to be measured, causing a so-called "shape" anisotropy in said direction orthogonal to the direction of the magnetic field to be measured. The length/width ratio of this oblong shape may be greater than or equal to 5. Moreover, given that the measurement of a magnetic field from a soft ferromagnetic material is nonlinear, it is possible to minimize this nonlinearity by maximizing the shape anisotropy field (which will depend on the shape and properties of the magnetic field) so that it is very large, for example with a ratio greater than or equal to 100, relative to the fields to be measured.

To minimize the nonlinearity of the measurement of a magnetic field made from a soft ferromagnetic material, it is also possible, when the magnetic means include a soft ferromagnetic material, for the sensor also to be able to have magnetization means for said ferromagnetic material able to magnetize the soft ferromagnetic material by a polarization magnetic field that can be fixed or variable, and such that the ferromagnetic material and these magnetization means are intended to form an electromagnet. These magnetization means may have at least one coil intended to be passed through by a steady or variable current, this coil being able to be incorporated into the structure and positioned on the body of the sensor, or for example to be outside the other elements of the sensor and have macroscopic dimensions.

Lastly, it is also possible for the soft ferromagnetic material to have properties similar to a hard ferromagnetic material, i.e. to have a magnetization that does not vary as a function of the outside magnetic field, by placing the ferromagnetic material in a particular stack of layers. In fact, the magnetic means may include a stack of one or more layers of ferromagnetic material arranged to alternate with one or more layers of antiferromagnetic material. In one such alternative, each stack of layers may form a set of parallel blocks detached from each other. These blocks may be in the shape of a rectangular parallelepiped, each block being able to have a portion of each layer of the stack. Moreover, when these blocks are elongated parallel to the direction of the magnetization axis, this introduces shape anisotropy in a direction orthogonal to the direction of the magnetic field to be measured.

In another alternative, the magnetic means may have at least one coil intended to be passed through by an electric current in a plane making it possible to generate an induced magnetic field with a direction perpendicular to the direction of the magnetic field to be detected.

In the case where the parameter sensitive to the field to be measured of the magnetic means may vary in a controlled manner (for example, when the magnetic means have at least one soft ferromagnetic material arranged in a variable polarization field, the sensitive parameter in this case corresponding to the magnetization of the ferromagnetic material, or when the magnetic means include at least one coil intended to be passed through by a variable current, the sensitive parameter corresponding in this case to the current of the coil), it is possible to make this sensitive parameter vary at a frequency substantially close to a mechanical resonance frequency of the body of the sensor, making it possible to cause the body of the sensor to resonate and to amplify the force applied on the detection means of the sensor by the quality factor of the mechanical resonator thus formed (which can be greater than 100,000). In this way, it is possible to increase the sensitivity of the sensor by this quality factor.

The body may have a box in which the magnetic means are arranged or a face on which the magnetic means are arranged.

In this way, the body may have a box in which the ferromagnetic material(s) are arranged or a face on which the coil is arranged.

The connection means may have at least one hinge. Preferably, this hinge may have a thickness smaller than or equal to that of the body.

The body may be substantially in the shape of a rectangular parallelepiped. The body may have two main parallel, or opposite, faces, relative to each other, the hinge being able to be connected to another face of the body substantially perpendicular to the two main faces of the body.

The suspended stress gauge may be of the piezoresistive type and have at least one beam, for example straight, composed of a semiconductor material or at least one beam composed of a metal material, for example bent into a U, a Greek fret, or a coil.

By implementing a piezoresistive detection, the sensor can operate at ambient pressure and therefore does not require encapsulation.

The detection means may also have means for measuring the electrical resistance of the suspended stress gauge.

The suspended stress gauge may be of the resonator type and have at least one vibrating beam, the detection means also being able to include means for exciting the vibrating beam and means for measuring a variation in the vibration frequency of the beam. Therefore, by performing such detection, for example implementing a capacitive detection of the resonance frequency of the vibrating beam, the electricity consumption of the sensor remains low. The vibrating beam can be a substantially longitudinal beam or a beam of any other shape, for example in the shape of a tuning fork.

The means for exciting the vibrating beam may have at least one voltage generator with direct and/or alternating components electrically connected to at least one excitation electrode coupled to the vibrating beam, and the means for measuring a variation in the vibration frequency of the beam may have at least one means for measuring a frequency variation of the electrical potential of at least one detection electrode coupled to the vibrating beam. The means for measuring the variation of the vibration frequency may be piezoresistive means.

In one alternative, the sensor may also have at least one second stress gauge suspended between the inlay portion and the body, the two suspended stress gauges being able to be arranged on either side of the axis of the pivot link. This alternative in particular allows differential magnetic field detection and thereby makes it possible to obtain better measuring precision of the magnetic field. Preferably, the stress gauges may be arranged symmetrically relative to the axis of the pivot link.

The sensor may have at least one stress gauge suspended between the inlay portion and the body mounted in a Wheatstone bridge. When the sensor has several suspended stress gauges, one or more of these stress gauges can be mounted in a Wheatstone bridge. In the event a single stress gauge is mounted in a Wheatstone bridge, the other resistors of the Wheatstone bridge can be reference resistors.

In another alternative, the sensor may also have:
  a second body comprising second magnetic means able to form a second torque applied on the second body by the action of the magnetic field to be detected substantially similarly to the first body,
  second connection means mechanically connecting the second body to an inlay portion of the sensor by at least one pivot link with an axis perpendicular to the direction of the magnetic field to be detected,
  second means for detecting a stress applied by the second body by the action of the second torque, having at least one second stress gauge suspended between the inlay portion and the second body and intended to work differentially in compression or tension relative to the first suspended stress gauge working in tension or compression, respectively.

This differential assembly makes it possible, due to the differential detection done by the sensor, to decorrelate a signal (in compression or tension) coming from an acceleration of a signal coming from a torque applied on the bodies by an outside magnetic field.

In another alternative, the body of the sensor, for example with a substantially rectangular parallelepiped shape, may have two main faces that are parallel to or opposite each other, and for example substantially square-shaped, and have a recess passing through both main faces, the sections in the planes passing through the two main faces being able for example to have a substantially square shape, the recess being able to be centered relative to the sections of the two main faces. In this case, the sensor may also have:
  at least two connection means that can each mechanically connect a wall of the body, each wall being perpendicular to the two main faces of the body and forming a side of the recess, to the inlay portion of the sensor arranged in the recess by a pivot link having an axis perpendicular to the direction of the magnetic field to be detected and perpendicular to the two main faces of the body,
  at least one piezoresistive stress gauge suspended between the inlay portion of the sensor and the body.

When such a sensor has several suspended stress gauges, said gauges may be arranged in pairs on either side of each of the axes of the pivot links of the connection means.

These alternative embodiments have the advantage of performing differential magnetic field measurements. These sensors are therefore barely or not at all sensitive to the accelerations that the sensors may undergo during a magnetic field measurement.

In another embodiment, the body may have a shape such that the center of gravity of the body is substantially close to, or at the level of the axis of the pivot link. In this way, the body forms a mass substantially balanced around the axis of the pivot link. This alternative makes it possible to minimize the sensitivity of the sensor to accelerations during a magnetic field measurement.

The center of gravity of the magnetic means may be substantially close to the axis of the pivot link.

The sensor may be of the MEMS and/or NEMS type.

Advantageously, the sensor may be made from a SOI substrate. By making this sensor using planar technology, for example in a SOI substrate, it is possible to co-incorporate it with, for example, a three-axis accelerometer that can be made in a similar manner, for example from the same substrate, or to make a differential sensor with this technology to go directly to the measurement of an acceleration. It is thus possible to produce altitude centers making it possible to perform both an orientation and a measurement of movements. Moreover, this sensor can form a MEMS and/or NEMS structure not requiring any assembly, which makes it possible to reduce its production cost and increase the robustness and compactness of the sensor.

The invention also relates to a magnetic field sensor with two or three directions respectively having two or three magnetic sensors as previously described, the magnetic sensors being arranged so that the directions of the magnetic fields intended to be measured by these sensors are perpendicular to each other. It is thus possible to measure, owing to several co-integrated single-axis sensors, the components of a magnetic field along 2 or 3 axes, including the axis perpendicular to the plane of the sensor.

When this sensor is a three-direction magnetic sensor, the axes of the pivot links of two of the magnetic sensors may be perpendicular to the axis of the pivot link of the third magnetic sensor.

Each magnetic sensor may have at least one ferromagnetic material, the magnetization direction of which can be perpendicular to the direction of the component of the magnetic field to be detected by said sensor and perpendicular to the axis of the pivot link of said sensor.

In one alternative, each magnetic sensor may have at least one ferromagnetic material whereof the magnetization direction is perpendicular to the axis of the pivot link of said sensor, the magnetization directions of the ferromagnetic materials of the three magnetic sensors being able to be very similar, and being able also to have at least one magnetic flux guide able to reorient magnetic field lines in a first direction perpendicular to the initial direction of said field lines, said magnetic flux guide being coupled to one of the three magnetic sensors such that this sensor can measure the magnetic field formed by said reoriented field lines.

The sensor may also have at least one fourth magnetic sensor similar to the sensor to which the magnetic flux guide is coupled, said magnetic flux guide possibly being able to orient the magnetic field lines according to a second direction perpendicular to the initial direction of said field lines and opposite the first reorientation direction of the field lines, the magnetic flux guide also being able to be coupled to the fourth magnetic sensor such that the fourth sensor can measure the magnetic field formed by said reoriented field lines in the second direction.

The magnetic flux guide may have at least one magnetic field lines amplification element.

In general, the measurement range of the magnetic field to be detected can be adjusted by modifying certain parameters of the magnetic means (for example the volume and/or nature of the magnetic material) and/or by modifying the size of the stress gauge and/or its positioning.

The invention also relates to a method for making a magnetic field sensor including at least the following steps:
  making a body comprising magnetic means able to form a torque applied on the body by the action of an outside magnetic field to be detected,
  making connecting means, separated from the body, mechanically connecting the body to an inlay portion of the sensor by at least one pivot link having an axis perpendicular to the direction of the magnetic field to be detected,
  making means for detecting a stress applied by the body by the action of the torque, separated from the connection means, having at least one suspended stress gauge whereof at least a first part is mechanically connected to the inlay portion, at least one second part being mechanically connected to the body, and at least a third part arranged between the first and second parts is suspended between the inlay portion and the body.

BRIEF DESCRIPTION OF THE DRAWINGS

The present invention will be better understood upon reading the description of embodiments provided purely for information and non-limitingly in reference to the appended drawings, in which.

Figure 1A:
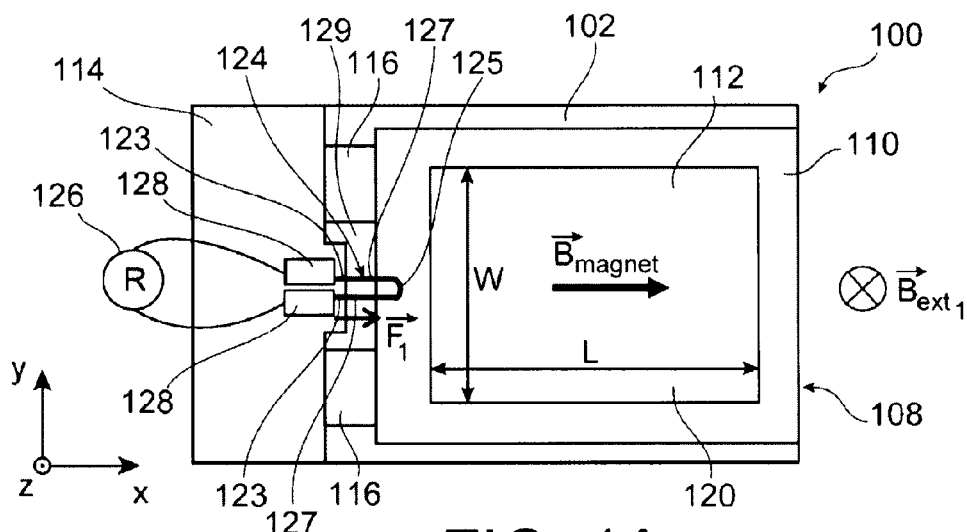
FIGS. 1A, 1B, 2A and 2B show top and profile views of magnetic field sensors, subject-matter of the present invention, according to first and second embodiments.

Identical, similar or equivalent parts of the different figures described above bear the same numerical references so as to facilitate the transition from one figure to the next.

The different parts shown in the figures are not necessarily shown using a uniform scale, to make the figures more legible.

The axes shown in the different figures described below and bearing the same references are similar from one figure to the next.

The different possibilities (alternatives and embodiments) must be understood as not being mutually exclusive and can be combined.

DETAILED DESCRIPTION OF SPECIFIC EMBODIMENTS

One example of a magnetic field sensor 100 according to a first embodiment will be described in connection with FIGS. 1A and 1B, which respectively show a top view and a profile view of the sensor 100.

The sensor 100 is made from a SOI substrate having a stack formed by a support layer 102 composed of semiconductor, a dielectric layer 104 and a superficial layer 106 also composed of semiconductor. The semiconductor of the layers 102 and 106 is for example monocrystalline or polycrystalline silicon. The superficial layer 106 could also be composed of SiGe or any other material of III-V type. The dielectric layer 104 is for example composed of $SiO_2$. In one alternative, the sensor 100 could be made from another type of substrate (bulk, semiconductor on glass, . . . ).

The sensor 100 has a body 108 forming a mobile portion of the sensor 100 and comprising magnetic means able to move the body 108 by the action of a magnetic field. In this first embodiment, the body 108 has a box 110 formed in the superficial layer 106 and in which a ferromagnetic material 112 is arranged forming a permanent magnet and having a permanent magnetization direction $B_{magnet}$ (shown by an arrow parallel to axis x in FIGS. 1A and 1B) perpendicular to the direction of an outside magnetic field $B_{ext1}$ (also shown by an arrow in FIGS. 1A and 1B) that the sensor 100 is intended to detect. The ferromagnetic material 112 is for example composed of CoPt, or NdFeB or SmCo.

In one alternative, the ferromagnetic material 112 may be a soft ferromagnetic material having a low coercivity, for example FeNi or CoFe. In this alternative, it is also possible for the sensor 100 to have magnetization means able to magnetize the ferromagnetic material 112 and to thereby form an electromagnet. These magnetization means may have a coil, arranged on the body 108 or next to the sensor 100, intended to be passed through by a variable or steady current.

In this first embodiment, the body 108 is in the shape of a rectangular parallelepiped whereof a first main face 118, called lower face, is in a plane passing through the face of the superficial layer 106 in contact with the dielectric layer 104, and parallel to the plane (X,Y), and a second main face 120, opposite the lower face 118, called upper face. The lower 118 and upper 120 faces are parallel to a plane called sensor plane 100, which in turn is parallel to the plane (X,Y). Moreover, the ferromagnetic material 112 also forms a rectangular parallelepiped-shaped block. In this first embodiment, the sensor 100 is intended to detect a magnetic field $B_{ext1}$ having a single component perpendicular to the plane of the sensor 100.

The body 108 for example has dimensions along the X and Y axes between about several micrometers, for example 20

μm, and 1 mm, and a thickness (dimension along the Z axis) equal to about 1 μm, or between about 0.1 μm and 10 μm, or several tens of micrometers. The block formed by the ferromagnetic material 112 has a width W (dimension along the y axis) that can be between several micrometers and 500 μm, for example equal to about 10 μm, and a length L (dimension along the x axis) that can be between about 20 μm and 500 μm, and for example equal to about 100 μm. The aspect ratio L/W of the block formed by the ferromagnetic material 112 may be significant and for example greater than or equal to about 5, in particular when the ferromagnetic material 112 is a soft ferromagnetic material.

The body 108, and more precisely the box 110, is connected to a fixed part of the sensor 100, or inlay portion 114, formed by a portion of the superficial layer 106, by two hinges 116. The hinges 116 are silicon portions etched in the superficial layer 106, which are substantially rectangular parallelepiped-shaped and have a thickness (dimension along the Z axis) between about several nanometers, or several tens of nanometers, and several micrometers, for example between about 50 nm and 500 nm. The hinges 116 form a pivot link having an axis parallel to the Y axis between the inlay portion 114 and the box 110. Each of the hinges 116 is connected to one end of a same side of the box 110 perpendicular to the main faces 118 and 120. In the example of FIGS. 1A and 1B, the hinges 116 are arranged in the continuation of the plane in which the lower face 118 of the body 108 is located. In one alternative, these hinges 116 may be connected at a different height from the body 108, for example in the extension of the plane in which the upper face 120 of the body 108 is located.

The sensor 100 has an empty space 122 formed between the body 108 and the support layer 102, as well as between the hinges 116 and the support layer 102. This empty space 122 corresponds to the space occupied by a portion of the dielectric layer 104 that was eliminated during the production of the sensor 100. Thus, at rest, i.e. when the body 108 is not stressed by an external magnetic field ($B_{ext1}=0$), the hinges 116 perform mechanical support of the body 108, maintaining it in a plane parallel to the plane of the sensor 100.

The sensor 100 also has means 124 making it possible to detect movement of the body 108 by the action of an external magnetic field $B_{ext1}$ oriented perpendicular to the permanent magnetization direction $B_{magnet}$ and perpendicular to the plane of the sensor 100. Such a magnetic field $B_{ext1}$ tends to make the magnetic mass 112, and therefore the body 108, undergo a rotation around the axis of the pivot link formed by the hinges 116 between the inlay portion 114 and the body 108. In the example of FIGS. 1A and 1B, this axis is parallel to the Y axis (and therefore perpendicular to $B_{magnet}$ and $B_{ext1}$) and passes through the junction between the hinges 116 and the inlay portion 114, at the middle of the thickness of the hinges 116. Furthermore, given that the hinges 116 are secured near the two ends of a same side of the body 108, these prevent possible external forces, for example due to the accelerations undergone by the sensor 100 and oriented in the plane of the sensor 100, from rotating the body 108 in the plane of the sensor 100, i.e. preventing the rotations of the body 108 along axes parallel to the Z and X axes.

The detection means 124 here are a stress gauge suspended between the inlay portion 114 and the upper face 120 of the body 108. This stress gauge 124 is arranged in a plane substantially parallel to the plane of the sensor 100. A space separates the stress gauge 124 from the hinges 116. Likewise, in one alternative embodiment where the hinges are made in the continuation of the plane of the upper face 120 of the body 108, the stress gauge 124 could in this case be suspended between the lower face 118 of the body 108 and the inlay portion 114. In general, the detection means 124 and the hinges 116 are not arranged in a same plane parallel to the plane of the sensor 100 so that the detection means 124 can detect a movement of the body 108 when it is subjected to the magnetic field $B_{ext1}$.

As a result, the rotational movement of the body 108 around the pivot axis formed by the hinges 116 amounts to the application of a force applied on the stress gauge 124, which is perpendicular to the magnetic field $B_{ext1}$ and is located in the plane of rotation of the body 108 (plane parallel to the plane X,Z)). In the example of FIGS. 1A and 1B, this force, shown by an arrow and designated by reference $F_1$, stretches the stress gauges 124 given that the rotation of the body 108 is oriented in the direction of the magnetic field $B_{ext1}$. If the magnetic field $B_{ext1}$ was oriented in the direction opposite that shown in FIGS. 1A and 1B, the stress gauge 124 would be subject to a force oriented in a direction opposite the force $F_1$ shown and that would compress the stress gauge 124.

The structure of this sensor 100 intrinsically creates an amplification of the stresses on the gauge 124 because the suspended stress gauge 124, the hinges 116 and the body 108 form a lever arm structure. Therefore, the smaller the distance between the hinges 116 and the stress gauge 124, the greater the compressive or stretching force applied on the stress gauge 124, resulting from the magnetic field.

In this first embodiment of the sensor 100, the stress gauge 124 is of the piezoresistive type and is formed by a metal beam. This beam here is bent into a "U." As a result, two ends 123 of the beam 124 are arranged against the inlay portion 114 and mechanically connected (by an inlay link) to the inlay portion 114, and a substantially semi-circular-shaped part 125, formed by the bent zone of the beam 124, of the beam is arranged against the body 108 and mechanically connected (by an inlay link) to the body 108. The stress gauge 124 here has two parts 127 arranged between the ends 123 and the semi-circular part 125 that are suspended between the inlay portion 114 and the body 108 in an empty space 129 formed between the body 108 and the inlay portion 114 and in which the two hinges 116 are located. Given the micrometric or nanometric dimensions of the beam 124, the latter can also be called micro-beam or nano-beam, or micro-wire or nano-wire. The beam 124 has an initial resistance R, when $B_{ext1}$ is zero, which varies by $+/-\Delta R$ when the beam 124 is compressed or stretched by movement of the body 108 in the presence of a non-zero magnetic field $B_{ext1}$, the value of $\Delta R$ being proportional to the value of $B_{ext1}$. In this way, by measuring the value of $\Delta R$, it is possible to deduce the value of $B_{ext1}$. In one alternative, the piezoresistive stress gauge 124 could be formed by a semiconductor-based beam, or more generally composed of any type of material having piezoresistive properties.

The sensor 100 has means 126 for measuring the electric resistance of the stress gauge 124, here an ohmmeter, connected to two electrical contacts 128. Each electrical contact 128 is formed by a metal portion arranged on the inlay zone 114, each electrical contact 128 being connected to one of the two ends of the stress gauge 124, i.e. one of the two ends of the beam 124. It is thus possible to measure the variations $\Delta R$ of the resistance of the strain gauge 124.

The sensor 100 therefore has magnetic field measuring means 124 suspended between the inlay portion 114, forming a stationary part of the sensor 100, and the body 108, forming a mobile part of the sensor 100. These measuring means 124 are therefore decorrelated from the structure sensitive to the magnetic field, i.e. the body 108 having the permanent magnet 112. The sensor 100 therefore has three parts that can, given the decorrelation between the measuring means 124 and the part which is sensitive to the magnetic field 108, be optimized independently of each other:
- a first part sensitive to the magnetic field and comprising the permanent magnet, i.e. the body 108,
- a second part sensitive to the stress obtained when the first part is subjected to a magnetic field, i.e. the detection means 124, and
- a third part connecting the first part to an anchor or inlay portion, i.e. the hinges 116.

This optimization may for example pertain to the thicknesses (dimensions parallel to the Z axis) of each of these parts, which can be chosen independently of each other.

Figure 2A:
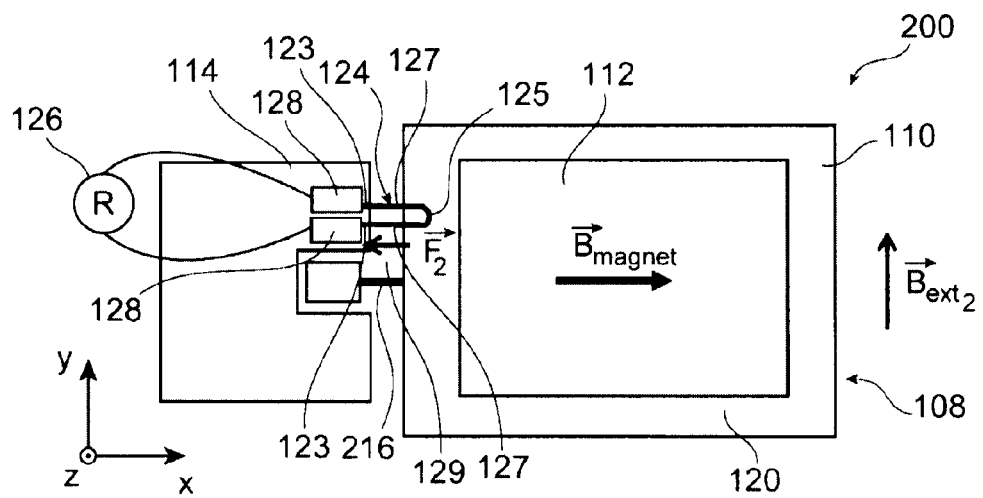
Figure 2B:
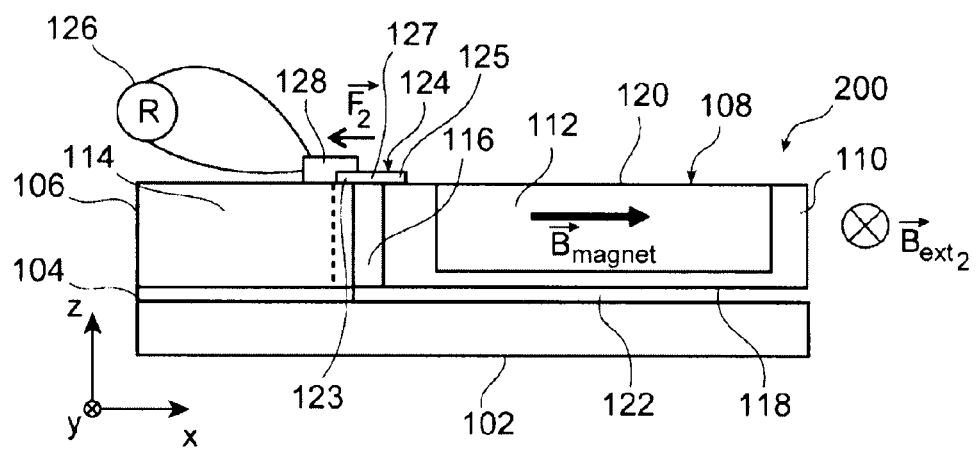

One example of a magnetic field sensor 200 according to a second embodiment will be described relative to FIGS. 2A and 2B, which respectively show a top view and a profile view of the sensor 200.

Similarly to the sensor 100 according to the first embodiment, the sensor 200 is made from a SOI substrate having layers 102, 104 and 106 (not shown in FIG. 2A), and comprises the body 108, the inlay portion 114, the stress gauge 124 and the measuring means 126.

Relative to the sensor 100, the sensor 200 is not intended to detect a magnetic field perpendicular to the plane of the sensor 200 (similar to the plane of the sensor 100 and parallel to the plane (X,Y)), but a magnetic field $B_{ext2}$ oriented in the plane of the sensor 200, here parallel to the Y axis, and perpendicular to the magnetization direction $B_{magnet}$.

To perform such a detection, the body 108 is not connected to the inlay zone 114 by the two hinges 116, but by a single hinge 216 connected to the body 108 over the entire thickness thereof, substantially in the middle of one side of the body 108 perpendicular to the two main faces 118 and 120 of the body 108, and arranged in the empty space 129 separating the body 108 from the inlay portion 114. This magnetic field $B_{ext2}$ tends to make the ferromagnetic material 112, and therefore the body 108, undergo a rotation around an axis perpendicular to the plane of the sensor 200. In the example of FIGS. 2A and 2B, this axis is parallel to the Z axis (and therefore perpendicular to $B_{magnet}$ and $B_{ext2}$) and passes through the junction between the hinge 216 and the inlay portion 114. The hinge 216 here performs the same mechanical support and pivot link role of the body 108 relative to the inlay portion 114 as the hinges 116 previously described.

The stress gauge 124 of the sensor 200 is made on the hinge 216 side. Therefore, in the presence of the magnetic field to be detected $B_{ext2}$ shown in FIGS. 2A and 2B (i.e. having a component parallel to the Y axis), the stress gauge 124 is compressed by a force $F_2$ as shown in FIGS. 2A and 2B, from which the value of $B_{ext2}$ can be deduced according to the same principle as the sensor 100 (measurement of the variation of the electric resistance of the stress gauge 124). If the component of the magnetic field to be detected is in the direction opposite $B_{ext2}$, the stress gauge 124 is then stretched by a force with a direction opposite the force $F_2$.

Figure 3:
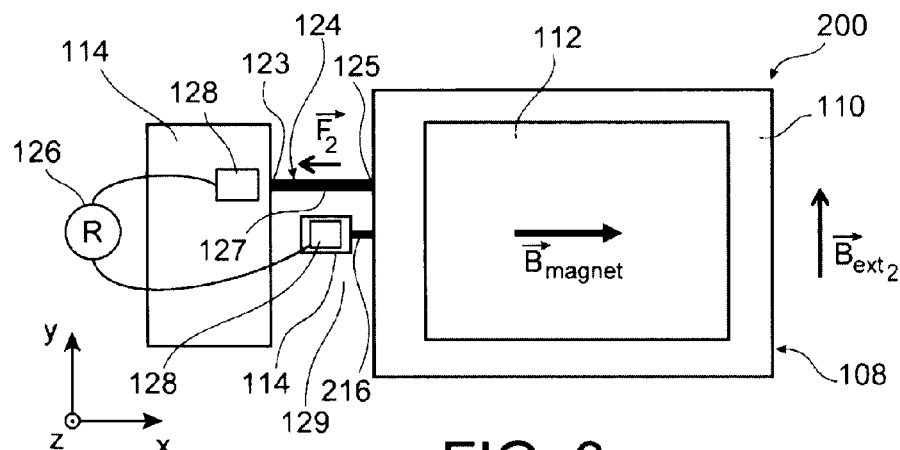
FIGS. 3 and 4 show top views of a magnetic field sensor, subject-matter of the present invention, according to alternatives of the second embodiment.

FIG. 3 shows a top view of the sensor 200 in a first alternative of the second embodiment. In this alternative, the detection means 124 do not have a piezoresistive stress gauge formed by a suspended metal beam, but by a suspended semiconductor beam. Here, this beam is silicon-based and is formed by etching a portion of the superficial layer of the SOI substrate from which the sensor 200 is made.

Relative to the suspended U-shaped metal beam, the silicon beam 124 here is substantially straight, and has a first end 123 mechanically connected (by an inlay connection) to the inlay portion 114, a second end 125 mechanically connected (by an inlay connection) to the box 110 of the body 108, and a central part 127 that is suspended in the empty space 129 formed between the body 108 and the inlay portion 114.

Given that the beam is made from the same material as the box 110 and the inlay portion 114, one of the electric contacts 128 here is formed on a first part of the inlay portion 114 close to the first free end of the beam 124 and a second electric contact 128 is formed on part of the inlay portion 114 to which the hinge 216 is connected. By connecting the ohmmeter 126 between the electric contacts 128, the resistance and resistance variation of the silicon beam 124 are measured, as well as the resistance of the silicon of the inlay portion 114 and the box 110 located between the ends 123, 125 of the beam 124 and the electric contacts 128. Given that the electric resistance of the silicon of the inlay portion 114 and the box 110 between the ends 123, 125 of the beam 124 does not vary, the measured resistance variation corresponds well to the variation of the electric resistance of the suspended beam 124.

This alternative in particular has the advantage of not imposing stresses on the locations of the electric contacts 128 in the magnetic sensor. Therefore, the electric contacts 128 can be arranged at places different from the ends of the beam 124. Furthermore, this alternative also allows a very substantial piezoresistive effect in the beam 124, in particular when the latter has a section with substantially nanometric dimensions.

Figure 4:
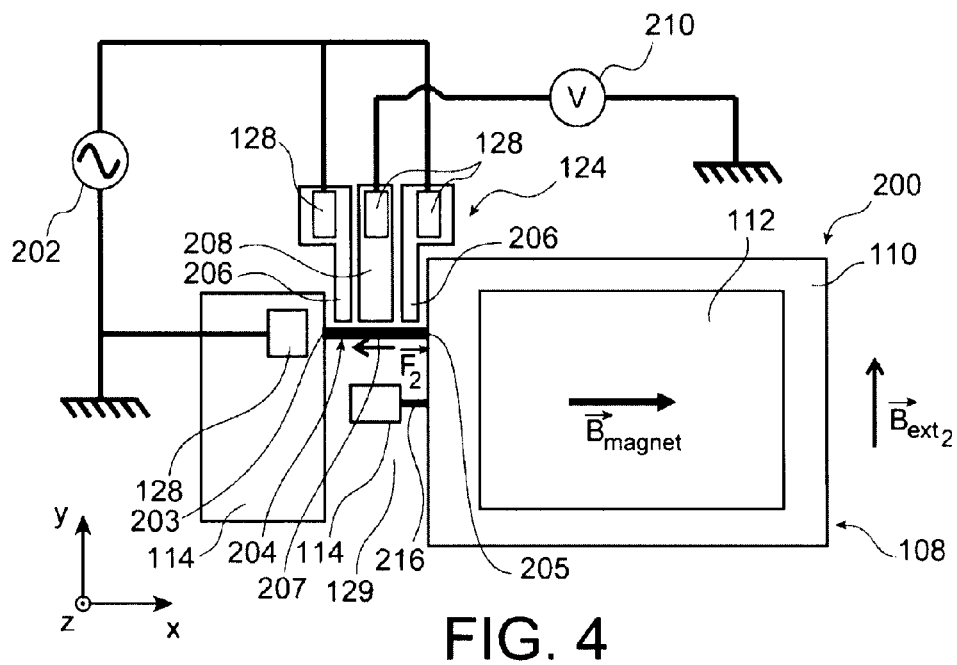

FIG. 4 shows a top view of the sensor 200 in a second alternative of the second embodiment. In this second alternative, the detection means 124 do not include a piezoresistive stress gauge, but a resonator 204, which can also be called vibrating leaf or vibrating beam, for example made by etching in the superficial layer 106, and including a first end 203 mechanically connected (by an inlay link) to the inlay portion 114, a second end 205 mechanically connected (by an inlay connection) to the body 108, and a central part 207 suspended between the inlay portion 114 and the body 108, in the empty space 129 formed between the body 108 and the inlay portion 114. The detection means 124 also include two excitation electrodes 206 intended to vibrate the resonator 204, as well as a detection electrode 208 arranged between the two excitation electrodes 206 and intended to detect a variation of the vibration frequency of the resonator 204. An electric contact 128 is formed on each of the electrodes 206 and 208, as well as on the inlay portion 114. A voltage generator 202, delivering a direct component and an alternating component, is connected to the two electric contacts 128 formed on the excitation electrodes 206. Lastly, a voltmeter 210 is connected between the electric contact 128 arranged on the detection electrode 208 and the mass (the inlay portion 114 also being connected to the mass).

Thus, when the force $F_2$ is applied on the resonator 204 because of the movement of the body 108 due to the presence of the magnetic field $B_{ext2}$, the vibration frequency of the resonator 204, equal to the frequency of the alternating component of the voltage applied between the excitation electrodes 206, this voltages being subjugated on the resonance frequency of the beam by the means for measuring the frequency variation, i.e. the voltmeter 210, is therefore modified. This frequency variation is detected by the detection electrode 208 and the voltmeter 210. From this measured frequency difference, it is then possible to deduce the value of $B_{ext2}$.

Figure 5A:
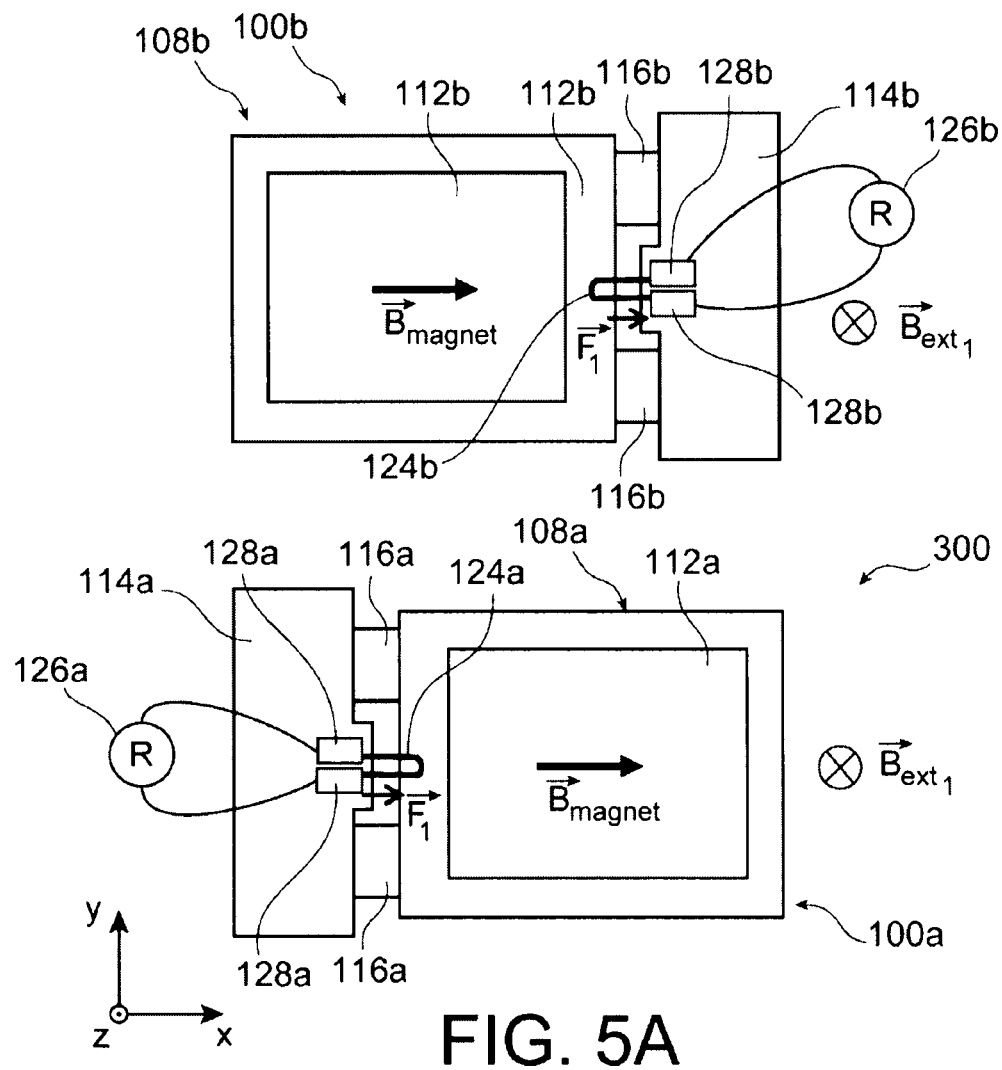
FIGS. 5A, 5B, 6A and 6B show top and profile views of magnetic field sensors, subject-matter of the present invention, according to third and fourth embodiments.
Figure 5B:
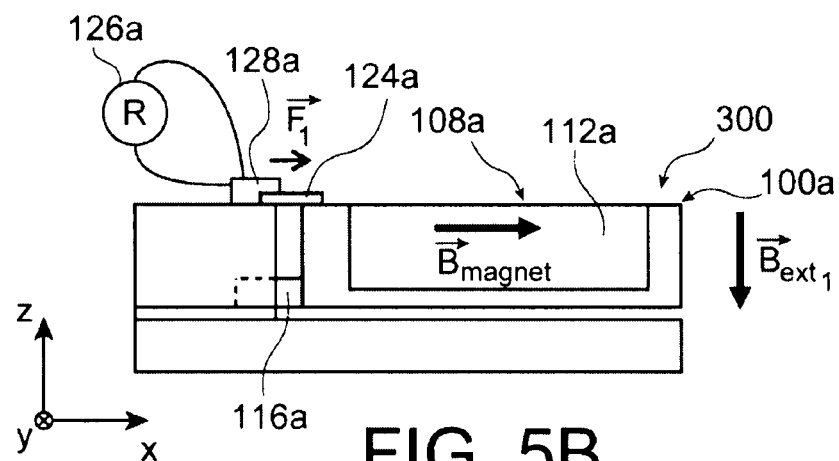

One example of this magnetic field sensor 300 according to a third embodiment will be described in connection with FIGS. 5A and 5B, which respectively show a top view and a profile view of the sensor 300.

This sensor 300 has a first detection structure 100a similar to the sensor 100 previously described. Moreover, the sensor 300 also has a second detection structure 100b having the same elements as the first detection structure 100a, but arranged differently. The bodies 108a and 108b of the two detection structures 100a and 100b are similar, the ferromagnetic materials 112a and 112b of the two structures 100a, 100b having the same magnetization direction ($B_{magnet}$) oriented parallel to the Z axis. However, the other elements of the two detection structures 100a and 100b, i.e. the inlay portions 114a, 114b, the hinges 116a, 116b, the detection means 124a, 124b and the electric contacts 128a, 128b are arranged axially symmetrically to each other relative to the others along an axis perpendicular to the plane (X,Y) that is parallel to the plane of the sensor 300 and the planes of the detection structures 100a and 100b. In this way, considering that the hinges 116a are connected to a first side of the body 108a in the first structure 100a, the hinges 116b are connected, in the second detection structure 100b, to a second side of the body 108b opposite a first side of the body 108b corresponding, by structural analogy, to the first side of the body 108a.

Thus, the sensor 300 makes it possible to perform a differential measurement of the magnetic field. When the bodies 108a, 108b of the two detection structures 100a, 100b are subjected to a same magnetic field, here $B_{ext1}$, the force $F_1$ created, which is similar in terms of orientation and value for the two detection structures 100a, 100b given the same magnetization orientation $B_{magnet}$ of the two ferromagnetic materials 112a, 112b, amounts to the stretching of the detection means 124a of the first detection structure 100a and a compression of the detection means 124b of the second detection structure 100b.

Such a differential sensor 300 has the advantage of not being sensitive to accelerations parallel to the magnetic field $B_{ext1}$ intended to be measured since, in the presence of such an acceleration, an additional compression and tension is undergone, in addition to the force $F_1$ created by the magnetic field $B_{ext1}$, on either side of the two detection means 124a, 124b. This additional compression and tension being complementary to each other, it is therefore possible to deduce, from measurements done using the ohmmeters 126a, 126b, the value of $F_1$ by doing away with the effects of the acceleration, and therefore to calculate the actual value of $B_{ext1}$.

Figure 6A:
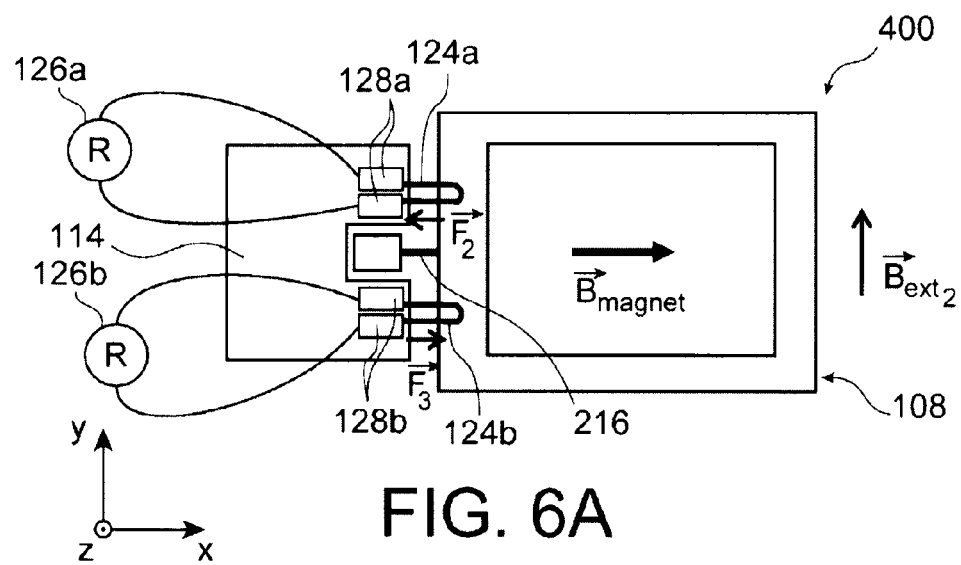
Figure 6B:
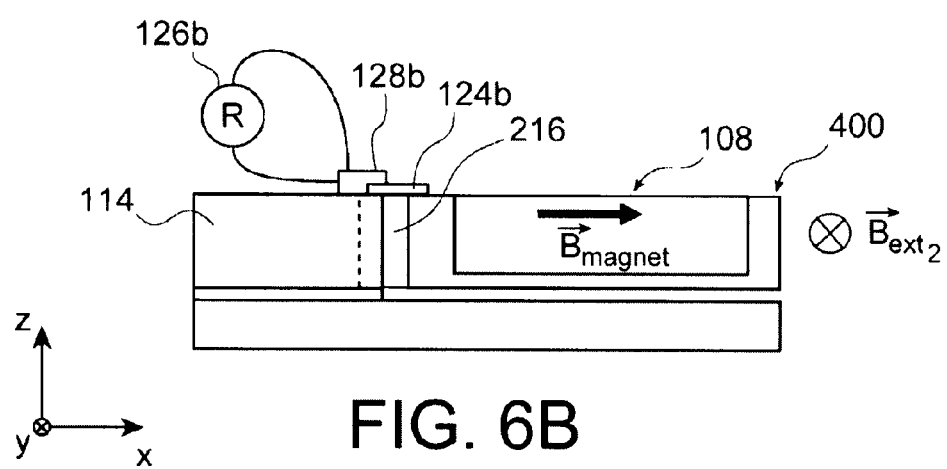

One example of a magnetic field sensor 400 according to a fourth embodiment will be described in connection with FIGS. 6A and 6B, which respectively show a top view and a profile view of the sensor 400.

Relative to the sensor 200 previously described, the sensor 400 has first detection means 124a, corresponding to the stress gauge 124 of the sensor 200, but also the second detection means 124b, for example similar to the first detection means 124a. These detection means 124a, 124b therefore each have a piezoresistive stress gauge formed by a metal beam bent into a "U" shape and suspended between the body 108 and the inlay portion 114. The hinge 216 is arranged between the first and second detection means 124a, 124b. One can therefore see that the stress gauges 124a, 124b are arranged on either side of the axis of rotation of the body 108 located at the hinge 216.

Therefore, similarly to the sensor 300, this sensor 400 forms a magnetic field differential measuring structure. When the body 108 is subjected to the magnetic field $B_{ext2}$ shown in FIGS. 6A and 6B, the movement of the body 108, corresponding to a rotation of the body 108 around an axis perpendicular to the plane of the sensor 400, amounts to a compressive force $F_2$ applied on the first detection means 124a, and a tension force $F_3$ applied on the second detection means 124b.

One example of a magnetic field sensor 500 according to a fifth embodiment will be described relative to FIG. 7, which shows a top view of the sensor 500.

Similarly to the sensors 100, 200, 300 and 400 previously described, the sensor 500 is made from a SOI substrate including a stack formed by a semiconductor-based support layer 102, dielectric layer 104, and a superficial layer 106 also composed of semiconductor. The sensor 500 has a body 508 comprising magnetic means. In this fifth embodiment, the body 508 has a box 510 formed in the superficial layer of the SOI substrate and in which a ferromagnetic material 512 is arranged forming a permanent magnet having a permanent magnetization direction $B_{magnet}$ perpendicular to the direction of an external magnetic field $B_{ext2}$ that the sensor 500 is intended to detect. The ferromagnetic material 512 is for example of a nature similar to the ferromagnetic material 112 previously described.

Figure 7:
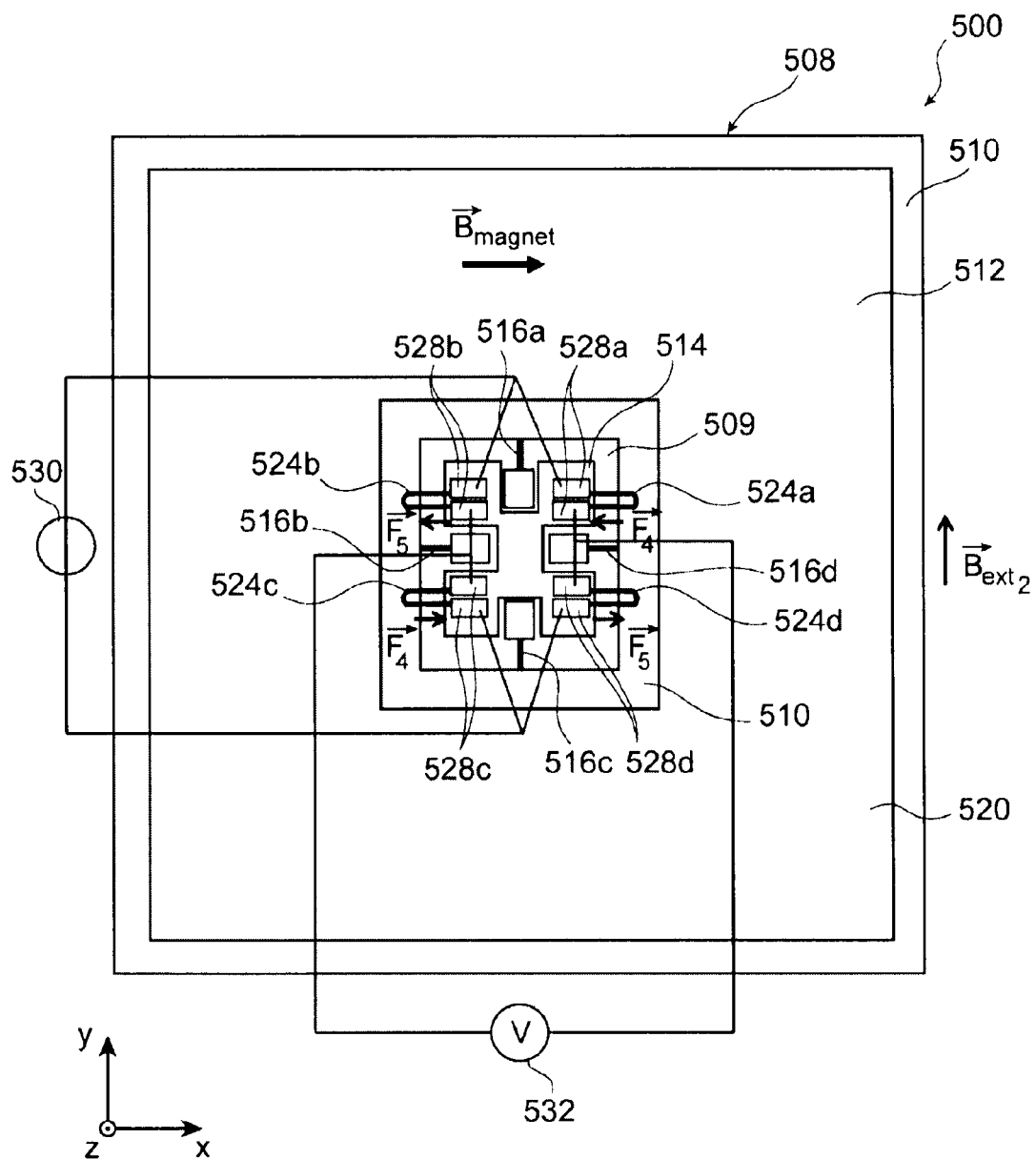
FIG. 7 shows a top view of a magnetic field sensor, subject-matter of the present invention, according to a fifth embodiment.

In this fifth embodiment, the body 508 has a rectangular parallelepiped shape whereof a first main face, called lower face and not shown in FIG. 7, is included in a plane passing through the face of the superficial layer in contact with the dielectric layer, and parallel to the plane (X,Y), and a second main face 520, opposite the lower face, called upper face. The lower and upper faces 520 are parallel to a plane called plane of the sensor 500 (parallel to the plane (X,Y)). The body 508 also has a recess 509 whereof the section in a plane parallel to the plane (X,Y) is substantially square-shaped. An inner wall of the box 510 forms the contour of the recess 509, and an outer wall of the box 510 forms the outer contour of the body 508.

The body 508 is connected to a stationary part of the sensor 500 called inlay portion 514 and formed in particular by a portion of the superficial layer arranged in the recess 509. The connection between the body 508 and the inlay portion 514 is made by four hinges 516a to 516d, for example similar to the hinge 216 previously described in connection with the sensors 200 and 400. The inlay portion 514 having a substantially square-shaped section in a plane parallel to the plane (X,Y), each of the hinges 516a-516d connects a side of the inlay zone 514 to a side of the inner wall of the box 510, at the recess 509.

The sensor 500 also has detection means comprising four piezoresistive stress gauges 524a to 524d, each formed by a metal beam bent into a "U" shape and suspended between a side of the box 510, at its inner wall delimiting the recess 509, and four corners of the inlay portion 514. The four piezoresistive stress gauges 524a-524d extend perpendicular to the direction of the magnetic field to be detected $B_{ext2}$, in plane (X,Y).

The magnetic field $B_{ext2}$ tends to make the ferromagnetic material 512, and therefore the body 508, undergo a rotation around an axis parallel to the Z axis, i.e. perpendicular to the plane of the sensor 500, and whereof the position in the plane of the sensor 500 corresponds substantially to the center of the inlay portion 514.

It therefore results that the rotational movement of the body 508 around the inlay portion 514 amounts to the application of a compressive force $F_4$ applied on two of the detection means 524a, 524c located at two opposite corners of the inlay portion 514 and a stretching force $F_5$ applied on the other two detection means 524b, 524d located at the other two opposite corners of the inlay portion 514, these two forces $F_4$ and $F_5$ being perpendicular to the magnetic field $B_{ext2}$ and located in the plane of the sensor 500. In the event the magnetic field to be detected is oriented in the direction opposite that of $B_{ext2}$, the compressive force $F_4$ would be applied on the detection means 524b, 524d and the stretching force $F_5$ would be applied on the detection means 524a, 524c.

The two ends of each of the piezoresistive stress gauges 524a-524d are connected to a pair of electric contacts 528a-528d formed on the inlay portion 514. In this fifth embodiment, one of the electric contacts of each of the four piezoresistive stress gauges 524a-524d is connected to a voltage generator $V_1$ 530, the other four electric contacts being connected to a voltmeter 532 measuring a voltage $V_2$, thereby forming a Wheatstone bridge. At the piezoresistive stress gauges 524a and 524c undergoing the compressive force $F_4$, there is therefore a resistance variation $-\Delta R$, and at the piezoresistive stress gauges 524b and 524d undergoing the stretching force $F_5$, there is therefore a resistance variation $+\Delta R$. Considering that the four stress gauges 524a-524d each have an initial resistance R similar to each other, one therefore has:

$$dV_2 = \frac{V_1(2 \times 4 \times dR \times R^3 - (-2 \times 4 \times dR \times R^3))}{(4 \times dR \times R^2)(4 \times dR \times R^2)} = V_1 \frac{dR}{R}$$

Or: $\Delta R = \frac{V_2 \times R}{V_1}$

The value of $B_{ext2}$ can then be deduced from the value of $\Delta R$.

Provided below as examples are theoretical values of characteristics obtained with the sensor 200 previously described and having a body 108 whereof the dimensions in the plane (X,Y), corresponding to the outer walls of the box 110, are equal to about 100 μm, and the thickness (dimension along the Z axis) of which is equal to about 1 μm. The stress gauge 124 of this sensor 200 here is a silicon nanowire mounted in a Wheatstone bridge with three reference resistors according to the principle previously described for the sensor 500, and with a height equal to about 500 nm, a width equal to about 100 nm, and a length equal to about 1 μm:

Sensitivity=21 V/V/T

Noise density (at 1 kHz, with a voltage Vbridge of 5V)=8 nV/Hz$^{0.5}$

Resolution (for a bandwidth of 50 Hz and a voltage Vbridge, i.e. the voltage at the terminals of the Wheatstone bridge, of 5V)=4, $2.10^{-10}$ T Full Scale (working range)=$9.10^{-4}$ T The magnetic field sensors 100 to 500 previously described perform a measurement of a magnetic field along a given axis, i.e. magnetic fields having a single component along an axis. It is also possible to make sensors performing a measurement of a magnetic field having components along two axes perpendicular to each other, i.e. performing a two-dimensional magnetic field measurement (sensor 2D). To that end, a first structure is made similar to one of the sensors previously described able to detect the magnetic field $B_{ext1}$ and a second structure similar to one of the sensors previously described able to detect the magnetic field $B_{ext2}$ that is perpendicular to $B_{ext1}$. The two structures therefore make it possible to measure the components of the magnetic field in two directions perpendicular to each other. A sensor 2D is thus obtained having two measuring structures that for example correspond to the sensors 100 and 200, or 100 and 400, or 100 and 500, or 300 and 200, or 300 and 400, or 300 and 500.

Figure 8:
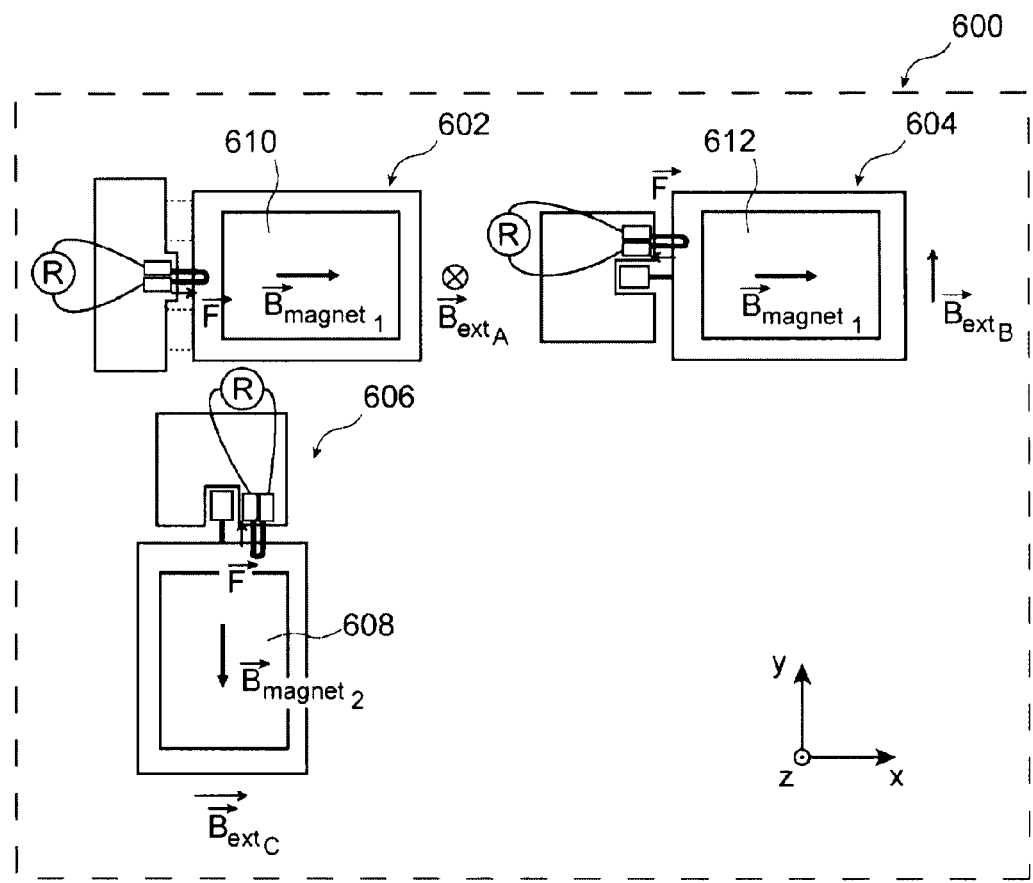
FIG. 8 shows a top view of a three-dimensional magnetic field sensor, subject-matter of the present invention, according to a specific embodiment.

It is also possible to make a sensor performing a measurement of a magnetic field having components along three axes perpendicular to each other, i.e. performing a magnetic field measurement in three directions. An example of one such sensor 600 is shown in FIG. 8. This sensor 600 has a first structure 602 similar to the sensor 100 previously described and able to measure a component $B_{extA}$ of the magnetic field to be measured parallel to the Z axis. In one alternative, this first structure 602 could be similar to the sensor 300. The sensor 600 also has a second structure 604 similar to the sensor 200 previously described and able to measure a component $B_{extB}$ of the magnetic field parallel to the Y axis. In one alternative, this second structure 604 could be similar to the sensor 400 or the sensor 500.

Lastly, the sensor 600 also has a third structure 606 that has the same elements as the second structure 604, but having undergone a 90° rotation in plane (X,Y). Thus, the stress gauge of this third structure 606, which undergoes a compressive or stretching force parallel to the Y axis, is therefore able to measure a component $B_{extC}$ of the magnetic field parallel to the X axis. The ferromagnetic material 608 of the body of this third structure has a magnetic orientation $B_{magnet2}$ perpendicular to the magnetic orientation $B_{magnet1}$ of the ferromagnetic materials 610 and 612 of the first and second structure 602 and 604, and parallel to the X axis. This ferromagnetic material 608 can be obtained, during the production of the sensor 600, either by depositing a ferromagnetic material having such a magnetic orientation from the beginning and therefore different from the ferromagnetic materials 610 and 612, or by first depositing the same ferromagnetic material as that of the first and second structures 604 and 606 (the three portions of ferromagnetic material 608, 610 and 612 therefore have the magnetic orientation $B_{magnet1}$), then by locally heating, for example by laser, while applying a perpendicular magnetic field by a value below the coercivity field of the magnets at ambient temperature, the ferromagnetic material 608 in order to modify this magnetic orientation until the magnetic orientation $B_{magnet2}$ is obtained.

The alternative embodiments previously described for the sensor 100 (use of a soft ferromagnetic material coupled or not coupled with magnetization means) may also apply to the sensors 200 to 600 previously described.

Figure 9A:
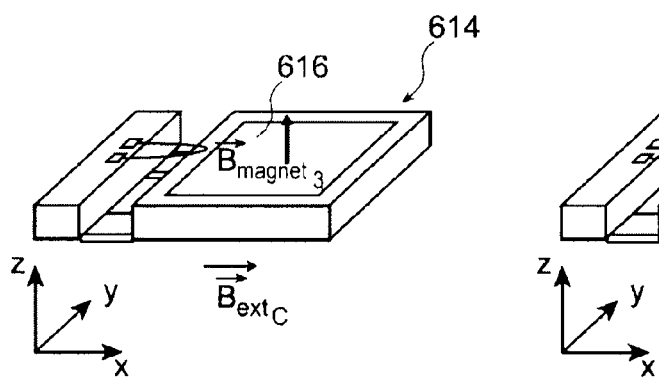
FIGS. 9A and 9B show alternative embodiments of the elements of a three-dimensional magnetic field sensor, subject-matter of the present invention.

In one alternative embodiment of this sensor 3D, the third structure 606 of the sensor 600 may be replaced by the structure 614 shown in FIG. 9A. This structure 614 is similar to the first structure 602, except concerning the ferromagnetic material 616 of this third structure, which has a magnetic orientation $B_{magnet3}$ parallel to the Z axis. Such a ferromagnetic material may be different at the outset from the ferromagnetic materials 610 and 612, or may be obtained by localized heating under a magnetic field of a ferromagnetic material similar to those of the first and second structures 602 and 604.

Figure 9B:
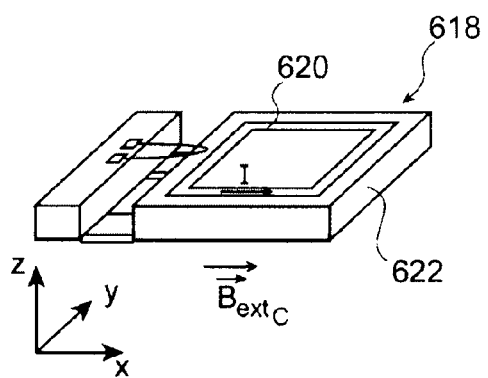

In a second alternative embodiment, the third structure 606 of the sensor 600 may be replaced by the structure 618 shown in FIG. 9B. This structure 618 is similar to the structure 614, except that this structure 618 does not have ferromagnetic material or a box. In fact, unlike the structures and sensors previously described, this structure 618 has a body 622 that here is semiconductor-based, for example silicon, in rectangular parallelepiped-shape and with dimensions for example similar to those of the body 108 described in connection with FIGS. 1A and 1B. A coil 620 is arranged on the periphery of a main face of the body 622. Thus, when this coil 622 is passed through by a current and in the presence of the magnetic field $B_{extC}$, the body 622 is subjected to a rotational force similar to that undergone by the magnetic material 616 of the structure 614. This structure 618 therefore makes it possible to detect the component $B_{extC}$ of the magnetic field parallel to the X axis.

Figure 10A:
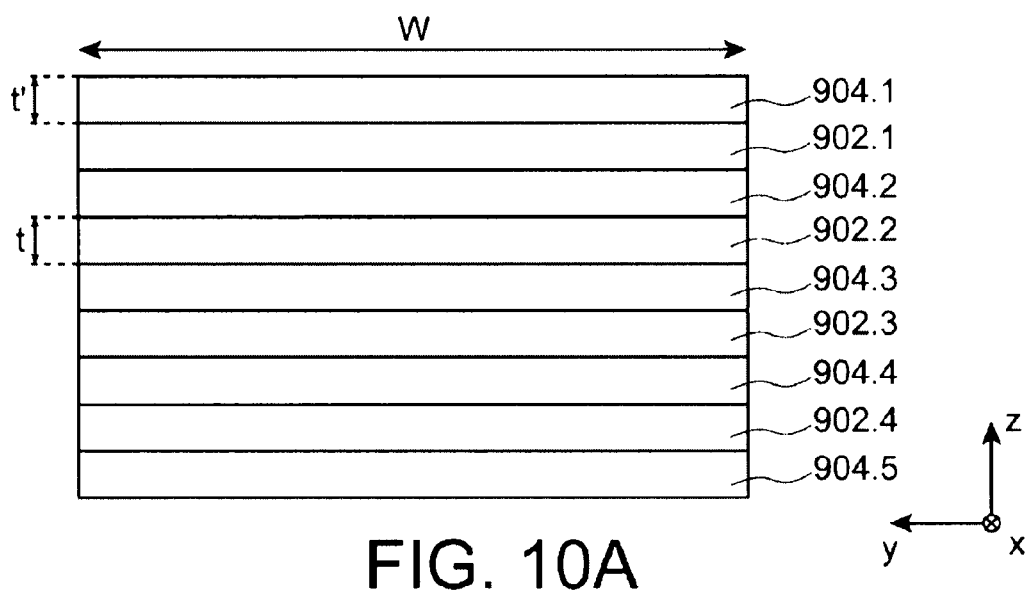
FIGS. 10A and 10B show examples of stacks of layers of ferromagnetic and antiferromagnetic materials of magnetic field sensors, subject-matter of the present invention.

In a third alternative embodiment, it is possible for the three structures 602, 604 and 606 to have, in the respective body of each of the structures 602, 604 and 606, not a single ferromagnetic material 608, 610, 612 as is the case in the example shown in FIG. 8, but a stack of layers comprising, alternatingly, layers composed of a ferromagnetic material and layers composed of an antiferromagnetic material, as shown in FIG. 10A. This stack may be formed so that each ferromagnetic material-based layer, referenced 902.1-902.4 in the example of FIG. 10A, is arranged between two layers of antiferromagnetic material 904.1-904.5.

The ferromagnetic material may be a soft ferromagnetic material, having a high saturation magnetization, for example greater than about 1000 emu/cm$^3$ (about 1.26 T). Such a ferromagnetic material may be an alloy of Fe, Co, and Ni. The antiferromagnetic material may be an alloy of Mn, for example of the NiMn, PtMn, or PdPtMn type. According to other examples, the antiferromagnetic material may be FeMn, IrMn, NiO, or Fe$_2$O$_3$.

Given that the layers of antiferromagnetic material 904.1-904.5 are arranged on either side of each of the layers of ferromagnetic material 902.1-902.4, an exchange coupling at the interfaces between the antiferromagnetic material and the ferromagnetic material makes it possible to block the magnetization of the layer of ferromagnetic material inserted in a direction defined during order annealing defining the magnetic orientation of these materials.

The layers of antiferromagnetic material 904.1-904.5 may have a thickness t' (dimension along the z axis shown in FIG. 10A), for example between about 2 nm and 50 nm, for example around 20 nm. The ferromagnetic material-based layers 902.1-902.4 may have a thickness t (dimension along the z axis shown in FIG. 10A) for example between about 2 nm and 40 nm, for example around 10 nm. This stack for example has a total number of layers between about 8 and 50 (9 in the example of FIG. 10A), the number of layers being adapted in particular as a function of the thicknesses t and t' of the layers so that the stack has a total thickness for example between about 100 nm and 600 nm, and for example substantially equal to about 100 nm.

These stacks of layers form, in each structure 602, 604 and 606 of the sensor 600, rectangular parallelepiped-shaped blocks, which are oblong or longilineal. Each block formed by such a stack of layers thus has a width W (dimension along the y axis of FIG. 10A, corresponding to the dimensions along the y axis for the structures 602 and 604 shown in FIG. 8, and along the x axis for the structure 606 of FIG. 8), for example between about 20 μm and 500 μm, for example around 20 μm, and a length L (dimension along the x axis of FIG. 10A, corresponding to the dimensions along the x axis for the structures 602 and 604 of FIG. 8, and along the y axis for the structure 606 of FIG. 8) for example between about 20 μm and 500 μm, for example around 100 μm. The aspect ratio L/W of each block may be substantial and for example greater than or equal to 5.

Figure 10B:
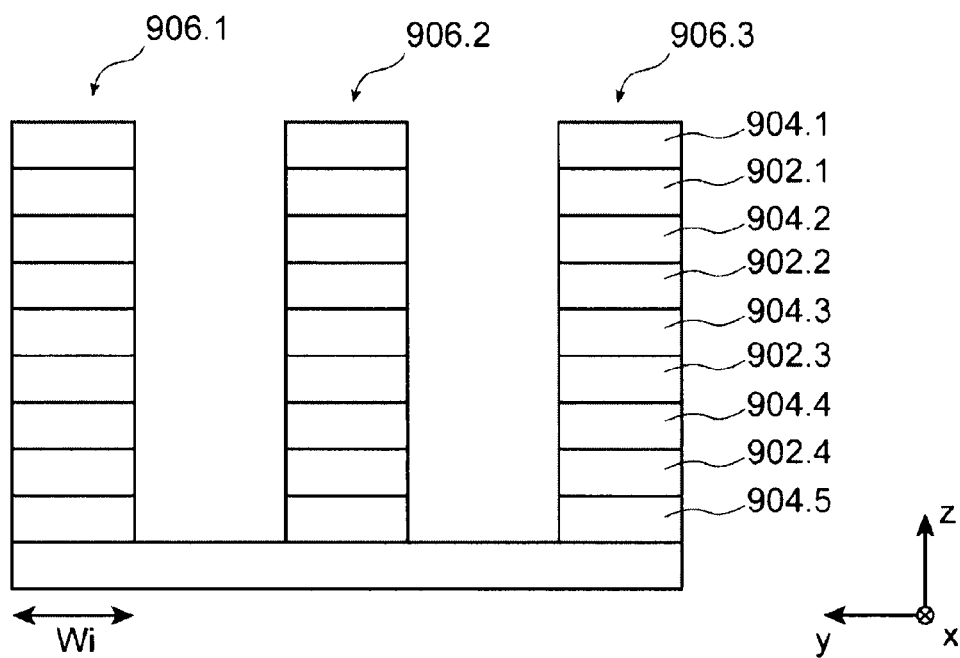

In one alternative, one or more of these stacks of layers of the structures 602, 604 and 606 may assume the form of a set of sub-blocks, referenced 906.1 to 906.3 in an example of FIG. 10B, rectangular parallelepiped, parallel and detached from each other. Subdividing the blocks, or stacks of layers, into parallelepiped sub-blocks, in particular each having a substantial aspect ratio between a length L and a width Wi, for example such as L/W$_i$≥10, makes it possible to introduce a shape anisotropy in a direction orthogonal to the direction of the magnetic field to be detected, and therefore to ensure a good alignment of the magnetizations along their respective main directions corresponding to the direction of their largest dimension L. This width Wi is for example between about 0.25 μm and 10 μm, and preferably smaller than about 5 μm. Such sub-blocks may be obtained by performing etching, for example of the IBE (ionic etching) type in the stacked layers of ferromagnetic and antiferromagnetic materials.

The stacks of layers of ferromagnetic and antiferromagnetic materials are intended to be oriented magnetically similarly to the magnetic materials 608, 610, and 612 shown in FIG. 8, i.e. along the direction of the magnetic orientation B$_{magnet1}$ for the structures 602 and 604, and in the direction of the magnetic orientation B$_{magnet2}$ for the structure 606, these two magnetic orientations B$_{magnet1}$ and B$_{magnet2}$ being perpendicular to each other.

During the production of the structures 602, 604 and 606 according to this alternative embodiment, after having made the stacks of layers 902.1-902.4 and 904.1-904.5, order annealing is done, the temperature of which makes it possible to order the antiferromagnetic material.

When the antiferromagnetic material is not orderly, for example of the NiMn, PtMn, or PdPtMn type, i.e. a material not having exchange coupling after deposition, the annealing step is performed at a temperature greater than or equal to the ordering temperature of this material. This ordering temperature is typically greater than about 250° C. For an orderly antiferromagnetic material such as FeMn, IrMn, NiO, or Fe$_2$O$_3$, i.e. that has an exchange coupling after deposition, the annealing step is performed at a temperature higher than the blocking temperature or the Nél temperature of this material, which is typically between about 150° C. and 250° C. The annealing may be done for example at a temperature above 260° C. when the antiferromagnetic material is PtMn.

During the annealing, in particular at the beginning thereof, a magnetic field $\vec{B}$ is applied, oriented so as to form a non-zero angle, and for example equal to about 45°, relative to the magnetic orientations B$_{magnet1}$ and B$_{magnet2}$.

The applied magnetic field may be a saturating field with intensity $\|\vec{B}\|$=Bsat provided to be above a predetermined field value corresponding to the saturation field of the blocks along their hard axis.

The hard axis is the axis for which the magnetic field applied to align the magnetization of the block, i.e. the stack of layers, is the greatest, which is the magnetic field needed to saturate the magnetization along the smallest dimension, i.e. the width W, of the stacks of layers. In a case where stacks of layers with different widths are made, a saturating magnetic field larger than the saturation field of the stack of layers with the smallest width is applied.

The applied saturating field may be much greater than said predetermined value, and may for example be around 1 T or 2 T.

During the annealing, the intensity of the applied magnetic field is reduced, so that the module of the applied magnetic field projected along the x axis, corresponding to the axis in which the length of the stacks of layers of the structures 602 and 604 is measured, is greater than or equal to a saturation field H$_L$ of the stacks of layers of the structures 602 and 604, and the module of the applied magnetic field projected along the y axis, corresponding to the axis in which the length of the stack of layers of the structure 606 is measured, is greater than or equal to the saturation field H$_L$ of the stack of layers of the structure 606.

Thus, the module of the applied magnetic field projected along the y axis is smaller than the saturation field of the stacks of layers of the structures 602 and 604 along their hard magnetization axis. Furthermore, the module of the applied magnetic field projected along the x axis is smaller than the saturation field along the hard magnetization axis of the stack of layers of the structure 606.

The module of the applied magnetic field projected along the y axis may be 20 times weaker than the saturation field of the stacks of layers of the structures 602 and 604 along their hard magnetization axis, so as to guarantee alignment of the magnetizations in the stacks of layers of the structures 602 and 604 at 5° of their main direction (direction parallel to their length L).

The saturation field $H_L$ of a stack of layers of length L oriented along the x axis may be evaluated using the following formula:

$$H_L = \frac{Wt}{L^2}\left[\ln\left(\frac{4L}{W}\right) - 1\right] * 4 * \pi * Ms$$

The saturation field $H_W$ of this same stack of layers along the y axis may be evaluated using the following formula:

$$Hw = 4 * \pi * Ms * t * \left[\frac{1}{t+W} - \frac{W}{L^2}\left[\ln\left(\frac{4L}{W}\right) - 1\right]\right]$$

with:
t: thickness of the set of ferromagnetic material-based layers for a stack;
$M_S$: saturation magnetization of the ferromagnetic material;
L: largest dimension of the layers of magnetic materials, i.e. the length;
W: smallest dimension of the layers of magnetic materials, i.e. the width.

For example, for stacks of layers about 100 µm long, 2 µm wide and about 100 nanometers thick, we have $H_L = 1.10^{-4}$ T and $H_W = 0.513$ T.

By applying a field of 0.03 T at 45°, it is possible to obtain an orientation of the magnetization at better than 5° of the major axis of a block irrespective of its orientation.

The module of the field projected along the smallest dimension is preferably smaller than about 5% of $H_L$ in order to ensure an alignment better than 5° relative to the largest dimension and smaller than about 2% for an alignment better than 2° relative to the largest dimension.

In the case where the stacks of layers of the structures 602 and 604 have different widths, different alignments will then be obtained relative to the main directions, i.e. the directions along the lengths L of each stack of layers.

For example, if the layers of the stack of the structure 602 have a first width W=W1=10 µm and the layers of the stack of the second structure 604 have a second width W=W2=2 µm, the layers of stacks of the structures 602 and 604 having a length L=100 µm, and a magnetic field for example equal to about 0.03 T is applied, the magnetization in the stack of layers of the structure 602 will be misaligned by about 20° relative to its main direction, while the misalignment will only be 5° in the stack of layers of the structure 604.

To avoid having to use excessively weak magnetic fields in the annealing furnace, it may be preferable to produce stacks of layers with width W smaller than about 2 µm.

After having reduced the intensity of the magnetic field, the annealing temperature is reduced so as to generate, in each stack of layers, an exchange between the antiferromagnetic material and the ferromagnetic material, which makes it possible to permanently freeze the magnetization directions.

At the end of the annealing, structures 602 and 604 are obtained each having a stack of layers of ferromagnetic and antiferromagnetic materials having a magnetization orientation identical in a direction that can be substantially parallel to that of the x axis or differ by less than 5° from that of the x axis, while the structure 606 may have a stack of layers of ferromagnetic and antiferromagnetic materials having a magnetization of a different orientation, which is substantially orthogonal to that of the stacks of layers of the structures 602 and 604.

With such a sensor, if a strong disruptive magnetic field like that of a magnet were to reverse the magnetization orientation of the structures 602, 604 and 606, this orientation would be restored once the magnet is distanced from the sensor. Along the small axis (width), the magnetization could turn in the presence of a magnetic disruption, but would return to its initial position at the end of the disruption.

Figure 11A:
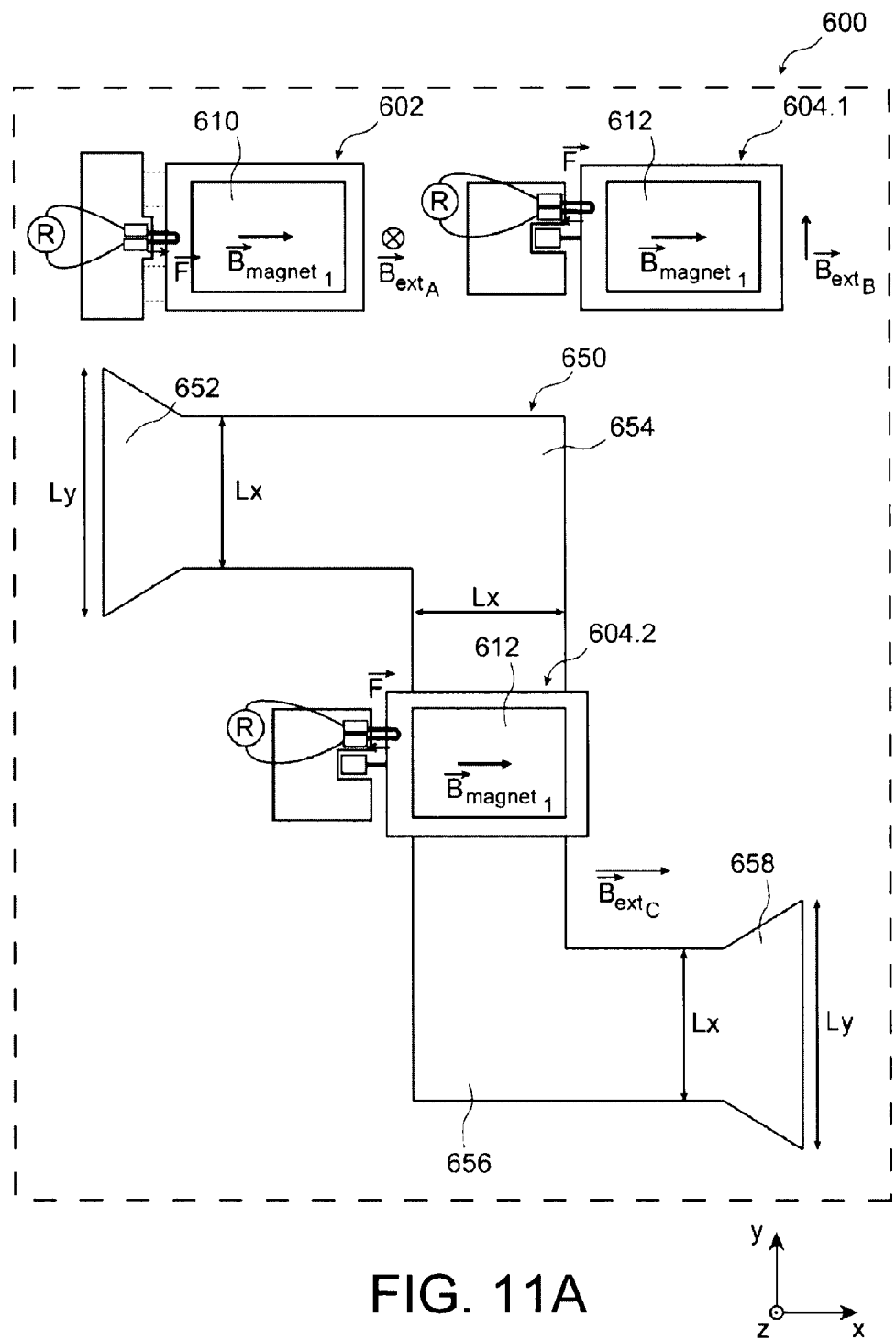
FIGS. 11A and 11B show alternative embodiments of a three-dimensional magnetic field sensor, subject-matter of the present invention, FIGS. 12A and 12B diagrammatically show examples of balanced bodies of magnetic field sensors, subject-matter of the present invention, according to specific embodiments.

In a fourth alternative embodiment of the sensor 600 shown in FIG. 11A, it is possible for the latter to be made from the first structure 602 and two structures 604.1 and 604.2 similar to the structure 604 shown in FIG. 8. Similarly to the sensor 600 shown in FIG. 8, the first structure 602 makes it possible to measure the component $B_{extA}$ of the magnetic field that is parallel to the z axis and the second structure 604.1 makes it possible to measure the component $B_{extB}$ of the magnetic field that is parallel to the y axis.

This sensor 600 also has a third structure 604.2, similar to the second structure 604.1. This third structure 604.2 is coupled to a magnetic flux guide 650 making it possible to reorient the component $B_{extC}$ of the magnetic field in a direction perpendicular to the magnetization direction $B_{magnet1}$ of the magnetic material 612 of the third structure 604.2, i.e. parallel to the y axis, allowing the third structure to measure the component $B_{extC}$ of the magnetic field.

The flux guide 650 is made from a soft ferromagnetic material and has a structure making it possible to reorient the magnetic field lines parallel to the x axis as magnetic field lines parallel to the y axis. The magnetic flux guide 650 has an input element 652 in funnel shape having an inlet with a width equal to Ly and an outlet with a width equal to Lx corresponding to the length (dimension along the x axis) of the block formed by the magnetic material 612. The input element 652 is connected to a first bent element 654 that forms a 90° angle and makes it possible to reorient, parallel to the y axis, the magnetic field lines that have entered the input element 652. This reoriented magnetic field can then be measured by the third structure 604.2. The magnetic flux guide 650 also has a second bent element 656 making it possible to reorient the field lines parallel to the x axis, these reoriented lines then being "evacuated" by an output element 658 in the shape of an inverted funnel, having an input with a width equal to Lx and an output with a width equal to Ly. The different elements of the magnetic flux guide 650 form a symmetrical structure around the third structure 604.2.

The input element 652 of the magnetic flux guide 650 makes it possible to perform an amplification of the field lines substantially proportional to the ratio Ly/Lx, which may for example be equal to about 5. In this way, for a component $B_{extC}$=50 µT, the induction measured by the third structure 604.2 may correspond to an induction oriented parallel to the y axis such that By=−218 µT. For a component $B_{extC}$=−50 µT, the induction measured by the third structure 604.2 may correspond to an induction oriented parallel to the y axis such that By=225 µT.

The use of one such magnetic flux guide 650 makes it possible to produce a three-axis sensor from structures that can all be made from a magnetic material with the same magnetic orientation ($B_{magnet1}$ in the example of FIG. 11A).

In the example of the sensor 600 shown in FIG. 11A, the third structure 604.2 coupled to the magnetic flux guide 650 makes it possible to measure the component $B_{extC}$ of the magnetic field. However, the third structure 604.2 is sensitive to the component $B_{extB}$ of the magnetic field as well as a possible acceleration parallel to the y axis. In order to desensitize the structure intended to measure the component $B_{extC}$ of the magnetic field relative to the component $B_{extB}$ of the magnetic field and an acceleration along the y axis, the sensor 600 may be made according to another alternative shown in FIG. 11B.

Figure 11B:
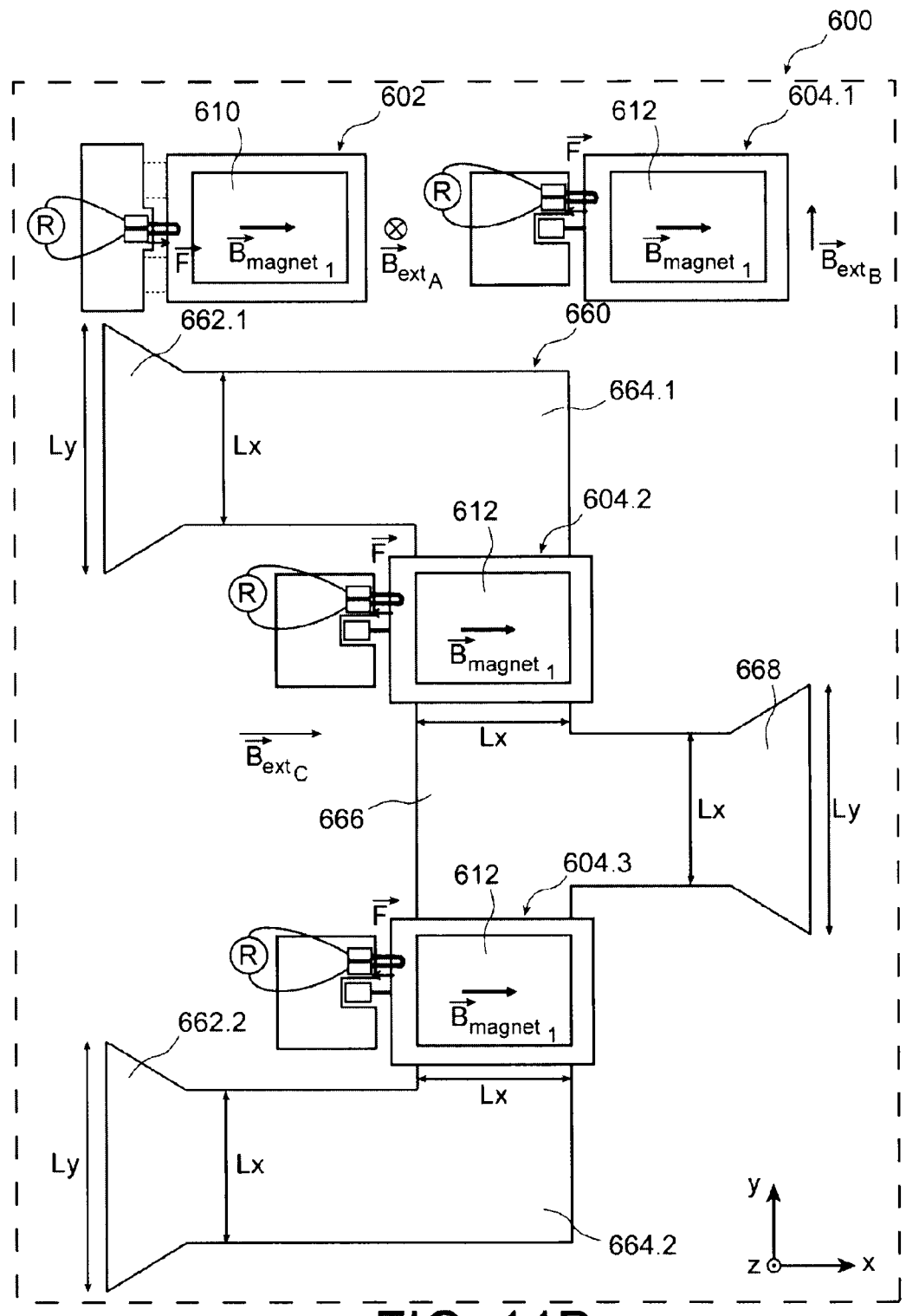

In this alternative embodiment of the sensor 600 shown in FIG. 11B, the latter includes the structure 602 and three structures similar to the structure 604 of FIG. 8, referenced 604.1, 604.2 and 604.3 in FIG. 11B. Similarly to the sensor 600 shown in FIG. 11A, the first structure 602 makes it possible to measure a component $B_{extA}$ of the magnetic field to be measured parallel to the Z axis and the second structure 604.1 makes it possible to measure a component $B_{extB}$ of the magnetic field parallel to the Y axis.

The other two structures 604.2 and 604.3 operate differentially so as to measure the component $B_{extC}$ of the magnetic field. To that end, these two structures 604.2 and 604.3 are coupled to a flux guide 660. The flux guide 660 has a first input element 662.1 and a first bent element 664.1, for example similar to the input element 652 and the first bent element 654 previously described relative to FIG. 11A, the first bent element 664.1 making it possible to bring the field lines reoriented parallel to the y axis into the third structure 604.2. Similarly, the flux guide 660 has a second input element 662.2 and a second bent element 664.2 making it possible to reorient the field lines of the component $B_{extC}$ of the magnetic field parallel to the y axis and in a direction opposite that of the reorientation done by the first input element 662.1 and the first bent element 664.1. The flux guide 660 also has a third element 666 making it possible to reorient the field lines leaving the structures 604.2 and 604.3 and to convey them towards an output element 668, for example similar to the output element 658 previously described relative to FIG. 11A.

In this alternative, the connection elements of the body and the stress gauges of the third and fourth structures 604.2 and 604.3 are arranged on the same side of the body so that the assembly formed by the third and fourth structures 604.2 and 604.3 as well as the magnetic flux guide 660 is insensitive to the component $B_{extB}$ of the magnetic field and an acceleration parallel to the y axis.

The input element(s) of the flux guides 650 and 660 may also be made so as not to be flared, these elements in this case having a uniform width Lx. In this case, the flux guides 650 and 660 reorient the field lines without prior amplification. It would also be possible for the input element(s) to be made not flared, but for the bent element(s) of the flux guides to have a flared portion so as not to amplify the field lines according to the component $B_{extC}$ of the magnetic field, but rather to amplify the field lines reoriented parallel to the y axis.

The sensors previously described are made using surface technology from a SOI substrate, thereby allowing these sensors to be made completely incorporated into the SOI substrate.

In one alternative of the sensors 100 to 500 previously described, the bodies of these sensors having a ferromagnetic material arranged in a box may be replaced by monolithic bodies each having a coil arranged on one of the main faces of the body, similarly to the detection structure 618 described above. Furthermore, in another alternative, the bodies of the sensors previously described may not include a box in which a ferromagnetic material is arranged, but instead be formed by several stacked layers of magnetic material.

Furthermore, in the sensors 100 to 600 previously described, the ferromagnetic material(s) used may be hard or soft. Lastly, when one of the sensors 100 to 600 is made with a soft ferromagnetic material, it is also possible for this material to be arranged in the form of a stack of layers composed of ferromagnetic or antiferromagnetic materials, as previously described in an alternative embodiment of the sensor 600.

When one of the sensors 100 to 600 uses a soft ferromagnetic material or a monolithic body having a coil (like for example the detection structure 618 previously described), i.e. when the parameter of the sensor sensitive to the field to be measured is variable, it is possible to vary this sensitive parameter to a frequency substantially close to a mechanical resonance frequency of the body of the sensor, making it possible to resonate the body of the sensor and amplify the force applied on the detection means of the sensor by the quality factor of the mechanical resonator thus formed.

In one alternative embodiment of the different sensors previously described in which the bodies are substantially rectangular and whereof the axis of the connecting means is substantially at one of the sides of the body, the bodies of these sensors may have a shape such that the center of gravity of the body is substantially at the pivot axis of the connection means of the sensor.

In fact, in the presence of an acceleration, the body of the sensor undergoes a force field $\delta \vec{F} = \rho \vec{\alpha}$, with $\vec{\alpha}$ the acceleration and $\rho$ the density of the material of the body. The torque resulting from this force field at a point of coordinates $\vec{r}$ may be written:

$$\vec{C}_{pivot} = \int_V (\vec{r} - \vec{r}_0) \times \delta \vec{F} dV,$$

where $\vec{r}_0$ is the coordinate of the pivot and V is the volume of the body. Given that $\delta \vec{F}$ can be considered as constant on the scale of the body, if the body is balanced at the pivot, translated by the fact that $$\int_V (\vec{r} - \vec{r}_0) dV = 0,$$

then the torque $\vec{C}_{pivot}$ applied on the body at the pivot is null, like the sensitivity of the body to the accelerations.

Likewise, the magnetic means situated on the body of the sensor may advantageously be balanced relative to the pivot so that the torque applied at this pivot and resulting from the force field applied on a magnetic material in the presence of a field gradient $\delta \vec{F} = (\vec{m} \cdot \overrightarrow{grad}) \vec{B}$ is substantially close to 0 in this case, and as a result the sensitivity of the sensor to the field gradients is as well.

Figure 12A:
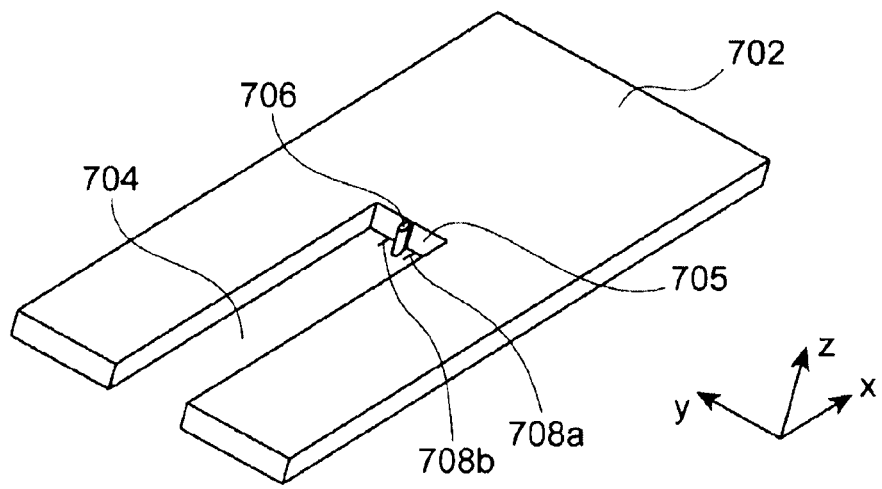

A first embodiment of one such body 702 is shown diagrammatically in FIG. 12A. The magnetic means, although not shown in this figure, are distributed in a balanced and homogenous manner on and/or in the body 702. In this FIG. 12A, the body 702 has a shape, in plane (x,y), that is substantially rectangular, the dimension of which along the x axis is larger than that along the y axis, having a recess 704 forming an access to the center of gravity of the body 702. The body 702 is therefore in the shape of a "U" whereof the center of gravity is substantially at a wall 705 revealed by the recess 704. The body 702 is connected to a hinge 706 substantially at its center of gravity (by the wall 705), this hinge 706 being intended also to be connected to an inlay zone of the sensor not shown in FIG. 12A. Two stress gauges 708a, 708b of the sensor having the body 702 are also connected to the wall 705 of the body 702. One such body 702 forms a mass balanced around the connection axis of the hinge 706 (axis parallel to the z axis) and may for example be used in the sensor 400 previously described, in place of the body 108, so as to detect a magnetic field oriented along the y axis.

Figure 12B:
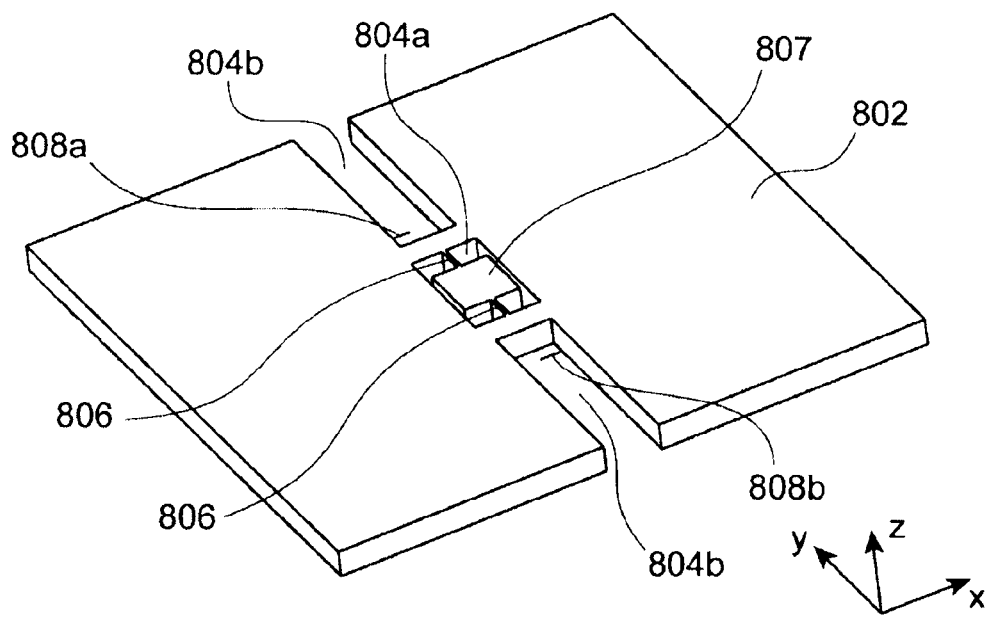

A second example of an embodiment of one such body 802 is shown diagrammatically in FIG. 12B. Here again, the magnetic means are not shown, but are, for example, distributed homogenously and balanced on and/or in the body 802. In this FIG. 12B, the body 802 is, in plane (x,y), substantially rectangular. The body 802 has a central recess 804 in which an inlay zone 807 of the sensor is arranged connected to the body 802 by two hinges 806 forming a connection axis parallel to the y axis substantially at the center of gravity of the body 802. The body 802 also has two other recesses 804b in which stress gauges 808a, 808b are arranged and connected to the body 802.

One such body 802 forms a mass balanced around the connection axis formed by the hinges 806 and may for example be used in the sensor 100 previously described, in place of the body 108, in order to detect a magnetic field oriented along the z axis.

It is also possible to encapsulate the sensors previously described, for example when one wishes for these sensors to operate in a particular atmosphere. Such an encapsulation can also make it possible to protect the ferromagnetic materials used such as NdFeB or SmCo, which are sensitive to corrosion and chemical attacks, and are mechanically fragile. Such an encapsulation may be done similarly to a traditional encapsulation for a MEMS-type device. Moreover, vacuum encapsulation of the sensors previously described makes it possible to reduce the Brownian noise. In that case, the magnetic materials may be protected by passivation layers.

Lastly, all of the sensors previously described may include a stress amplification cell for example comprising at least two rigid arms mechanically connected to each other by at least one connecting element at a first of their ends, a second end of a first of the two rigid arms being mechanically connected to the body, a second end of a second of the two rigid arms being connected to an inlay zone, said connecting element, or the first ends of the two rigid arms, being mechanically connected to one end of the suspended stress gauge (this end corresponding to the one connected to the body of the sensors previously described). Such a stress amplification cell may in particular be made in the plane of the sensor, for example in the superficial layer of the SOI substrate from which the sensor is made. By coupling the magnetic field sensors previously described with one or more stress amplification cells, the sensitivity of the magnetic field measurements done by these sensors is improved.

Figure 1B:
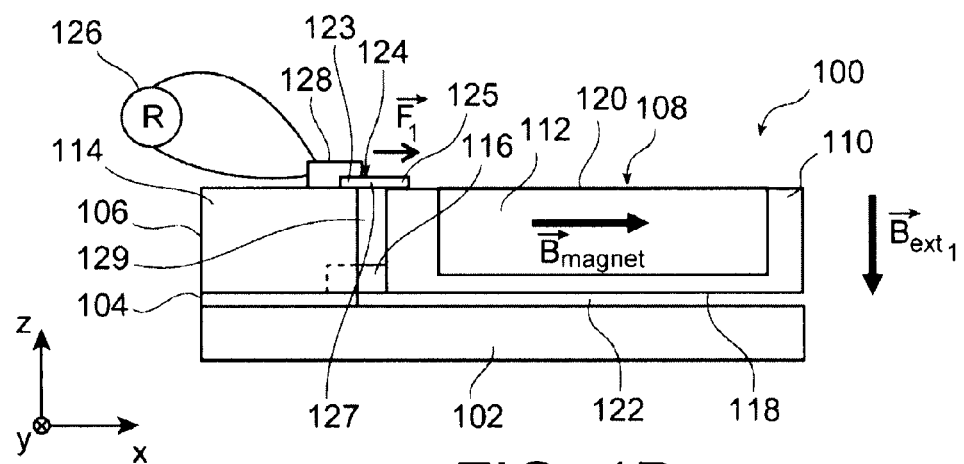

Described relative to FIGS. 13A to 13J (profile views) is an example of a first method of producing the sensor 100 previously described relative to FIGS. 1A and 1B.

Figure 13A:
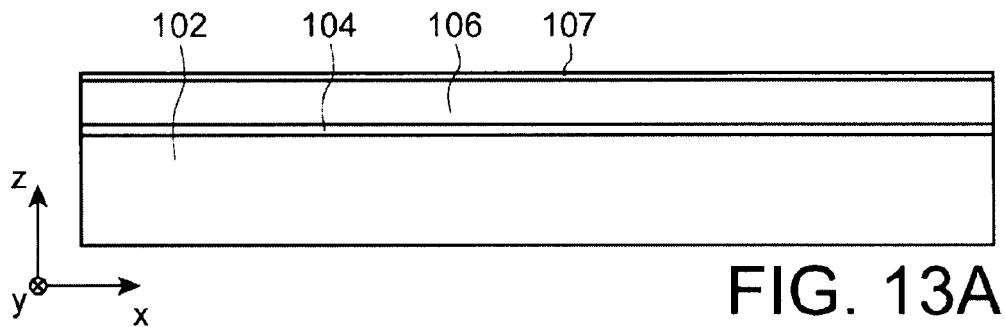
FIGS. 13A to 13J and 14A and 14H show steps of a method for producing a magnetic field sensor, subject-matter of the present invention, according to specific embodiments.

As shown in FIG. 13A, the sensor 100 is made from a SOI substrate having the layers 102, 104 and 106 previously described. In this embodiment, the layer 102 of silicon has a thickness equal to about 750 μm, the layer of $SiO_2$ 104 is about 0.4 μm thick, and the superficial layer of silicon 106 is about 5 μm thick. A SiN-based layer 107 is also deposited on the superficial layer 106, for example by LPCVD (low pressure chemical vapor deposition). This layer 107 is intended to form an etching mask.

Figure 13B:
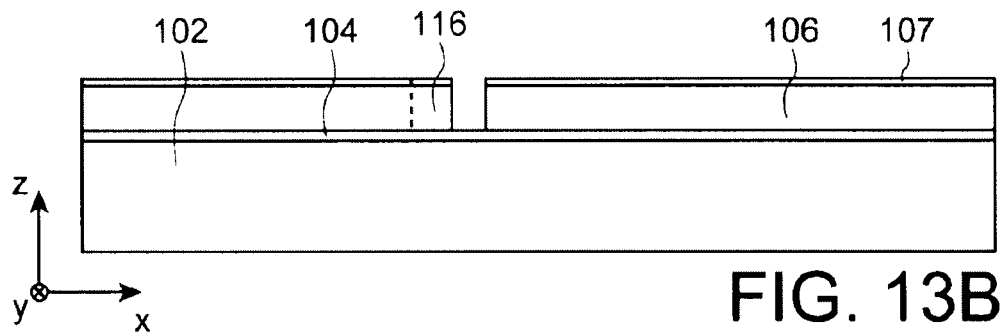

Lithography and etching are then done, by DRIE (deep reactive ion etching), in the superficial layer 106 to free portions of the superficial layer 106 intended to form the hinges 116 (FIG. 13B). This etching is done with a stop on the dielectric layer 104.

Figure 13C:
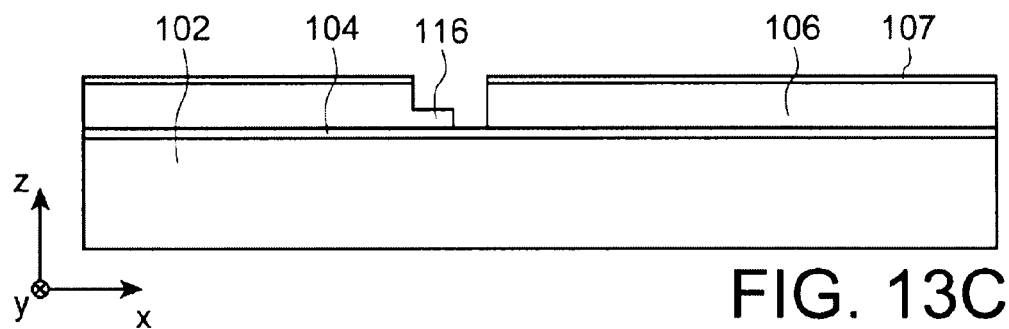

As shown in FIG. 13C, said portions of the superficial layer 106 are then thinned in order to form the hinges 116. This thinning is done until the desired thickness (dimension along the z axis) is obtained for the hinges 116. This thinning is done when the hinges have a thickness smaller than that of the body of the sensor, as is the case for the sensors 100 and 300. However, when one of the hinges 200, 400 or 500 is made in which the thickness of the hinge is substantially equal to that of the body, this thinning step is not carried out.

Figure 13D:
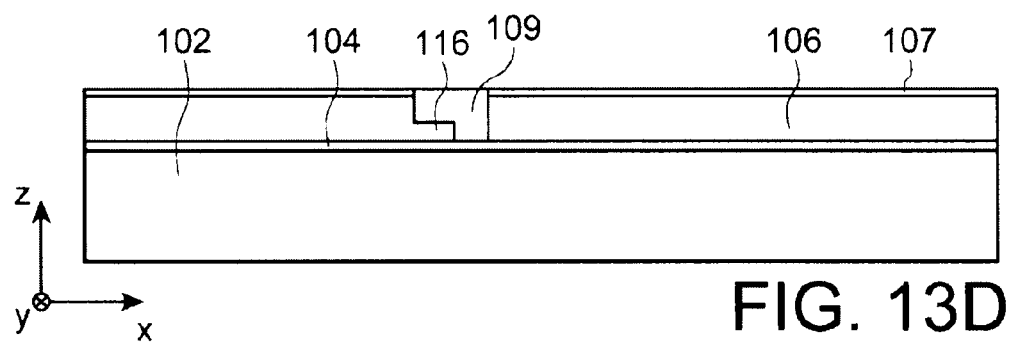

A plugging oxide 109 is then deposited, for example phosphosilicate glass, on the entire device in order to temporarily fill the empty spaces around the hinges 116. The plugging oxide on the layer of SiN 107 is then removed, for example by mechanochemical planarization with a stop on the SiN layer 107 so as only to keep the plugging oxide 109 found in the cavities formed in the superficial layer 106 by the preceding etching step (FIG. 13D).

Figure 13E:
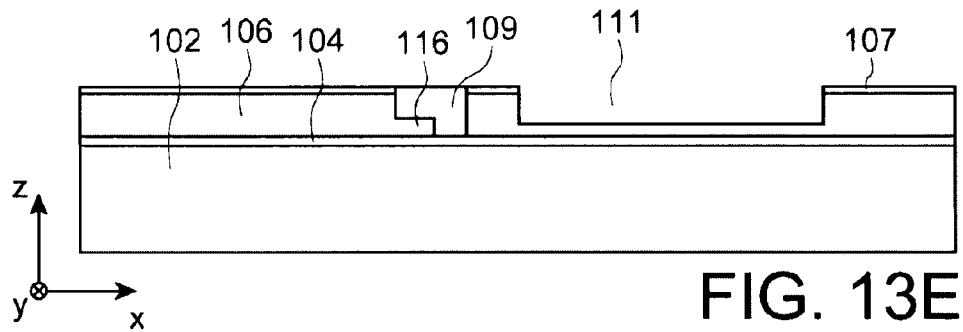

As shown in FIG. 13E, lithography and time etching are done, for example DRIE, in the superficial layer of silicon 106 with a stop in the superficial layer of silicon 106 to form a location 111 in which the ferromagnetic material 112 of the sensor 100 is intended to be deposited.

Figure 13F:
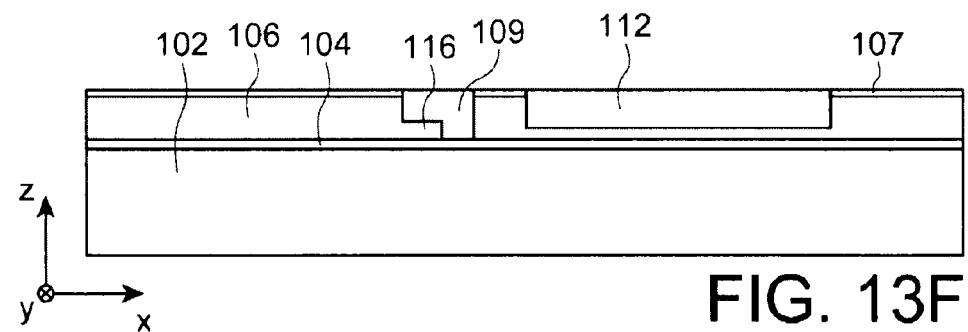

The ferromagnetic material is then deposited on the entire device in order to fill the location 111. The ferromagnetic material located on the SiN layer 107 is then removed, for example by mechanochemical planarization with a stop on the SiN layer 107 so as only to keep the ferromagnetic material 112 found in the location 111 (FIG. 13F).

Figure 13G:
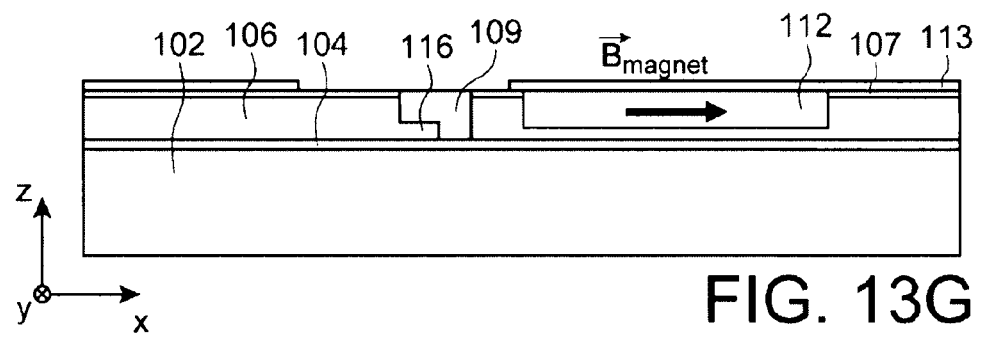

Annealing and a magnetization of the ferromagnetic material 112 are then done so as to define the magnetization direction $B_{magnet}$ of the material 112, here parallel to the X axis. A passivation layer 113 is then deposited, for example composed of SiN and for example with a thickness equal to about 0.3 μm, on the device, except in the location where the stress gauge is intended to be suspended (FIG. 13G).

Figure 13H:
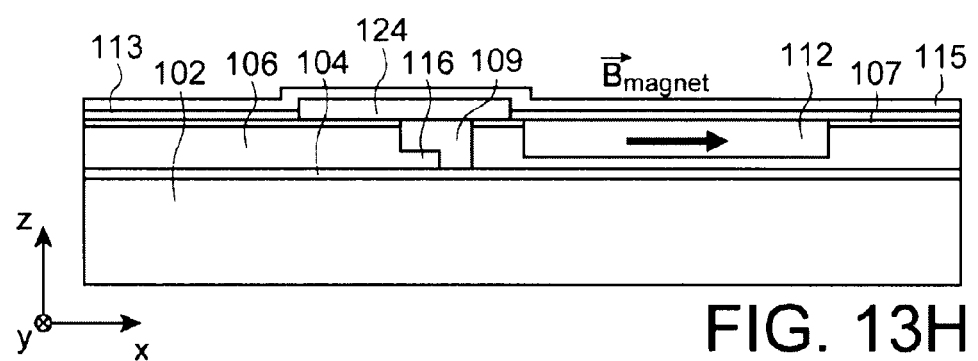

A deposition of the metal gauge 124 is then done, then a deposition of a $SiO_2$-based protective layer 115 on the entire device, in particular intended to protect the stress gauge 124 (FIG. 13H).

Figure 13I:
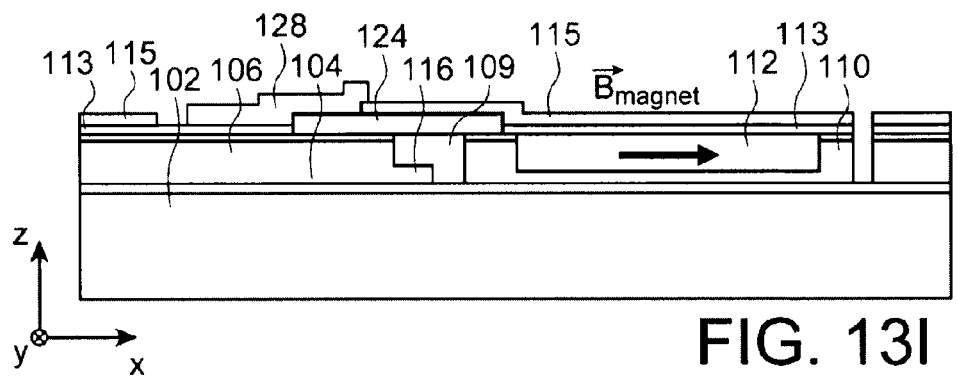
Figure 13J:
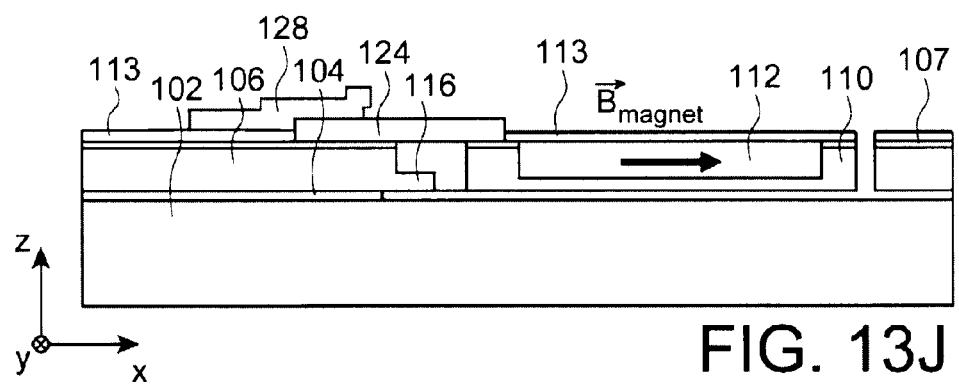

As shown in FIG. 13I, openings are then formed in the protective layer 115 and in particular above the free ends of the stress gauge 124 in order to produce the electric contacts 128 by deposition of metallizations, and deep etching is also done in the superficial layer 106 so as to delimit and form the contour of the box 110. Lastly, etching is done of the oxide present on the device, i.e. the protective layer 115, as well as the plugging oxide 109 and the portion of the layer of $SiO_2$ 104 located under the box 110 and under the hinges 116, thereby freeing the body 108 and the hinges 116 from the rest of the sensor 100 (FIG. 13J).

Although the steps above were described for the production of the sensor 100, they may also apply to the production of the other sensors 200, 300, 400, 500 and 600 previously described.

In reference to FIGS. 14A to 14H (profile views), we will now describe an example of a second method of producing the sensor 200, in its alternative described relative to FIG. 3, i.e. having a piezoresistive gauge formed by a silicon beam.

Figure 14A:
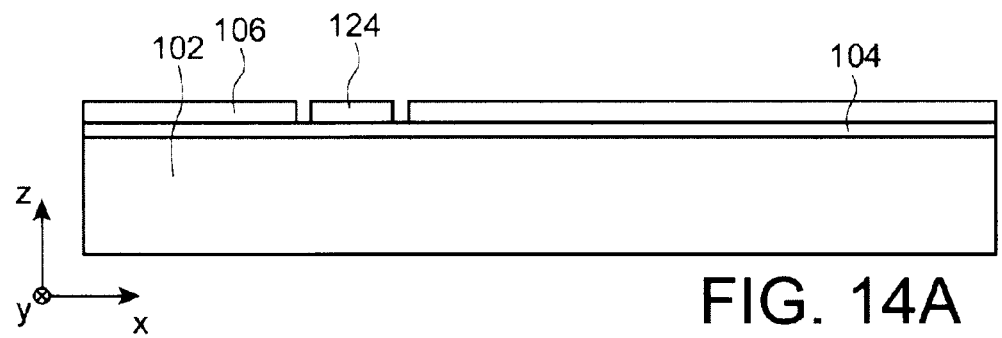

As shown in FIG. 14A, the sensor is made from a SOI substrate having the layers 102, 104 and 106 previously described. In this embodiment, the layer 102 of silicon has a thickness of about 750 μm, the layer of $SiO_2$ 104 is about 0.4 μm thick, and the superficial layer of silicon 106 is about 200 nm thick. Etching is done in the superficial layer 106 so as to form the piezoresistive gauge 124, i.e. here a silicon nanobeam.

Figure 14B:
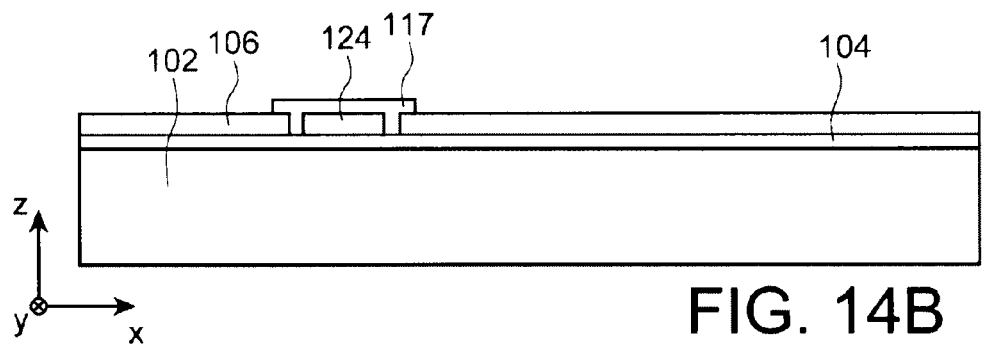

As shown in FIG. 14B, an oxide deposition is then done on the device, thereby filling the zones previously etched in the layer 106 defining the piezoresistive stress gauge 124. This oxide is then etched so as to keep only a portion 117 at the piezoresistive gauge 124.

Figure 14C:
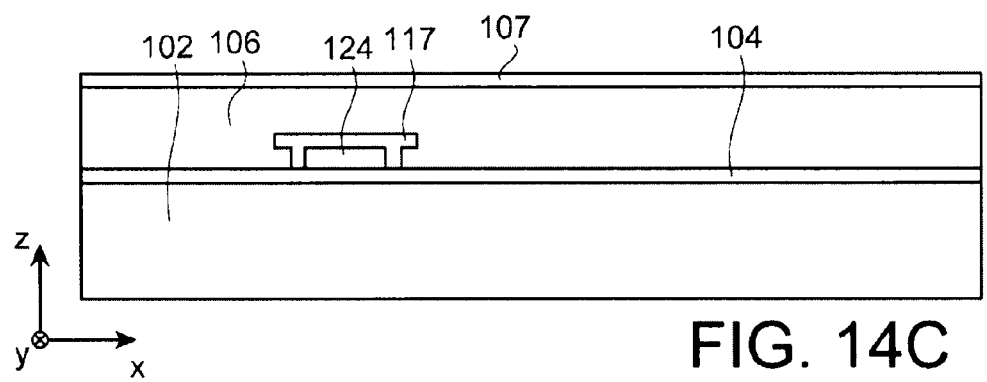

A thick epitaxy of the silicon layer 106 is then done, covering in particular the oxide portion 117, then a passivation layer 107, here SiN-based, is deposited on the epitaxied layer 106 (FIG. 14C).

Figure 14D:
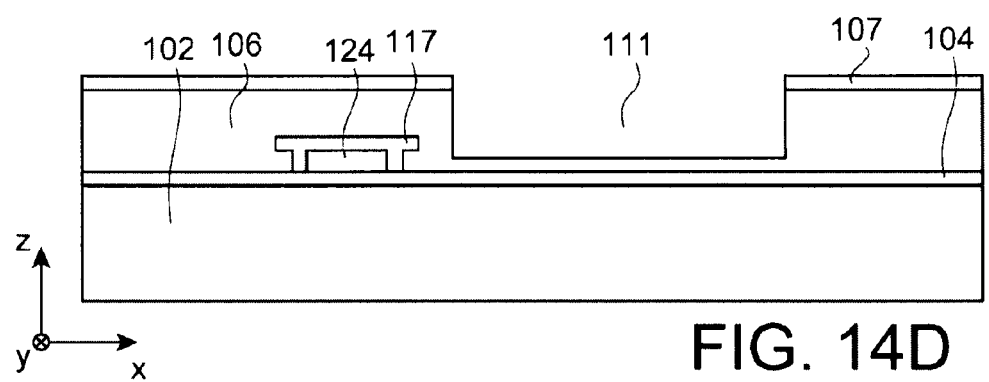

Similarly to FIG. 13E, lithography and time etching, for example DRIE, are done in the epitaxied silicon layer 106, with a stop in the epitaxied silicon layer 106, to form the location 111 in which the ferromagnetic material 112 of the sensor 200 is intended to be deposited (FIG. 14D).

Figure 14E:
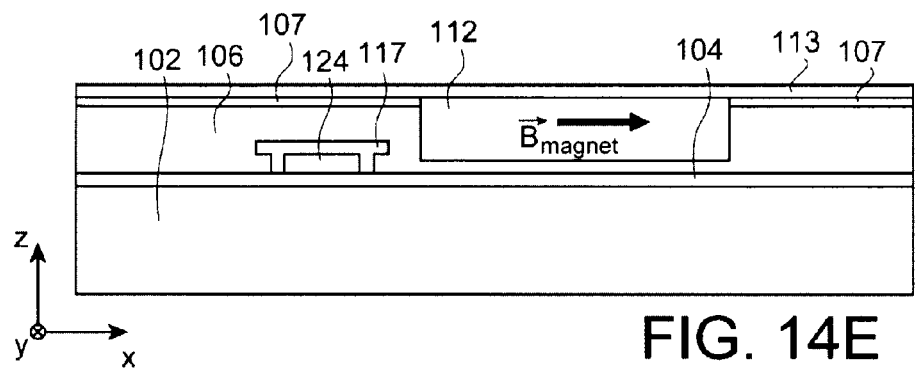

The ferromagnetic material is then deposited on the entire device so as to fill in particular the location 111. The ferromagnetic material located on the layer of SiN 107 is then removed for example by mechanochemical planarization with a stop on the SiN layer 107 so as to keep only the ferromagnetic layer 112 in the location 111. An annealing and magnetization of the ferromagnetic layer 112 is then done so as to define the magnetization direction $B_{magnet}$ of the material 112, here parallel to the X axis. A passivation layer 113 is then deposited, for example composed of SiN and for example with a thickness equal to about 0.3 µm, on the device (FIG. 14E).

Figure 14F:
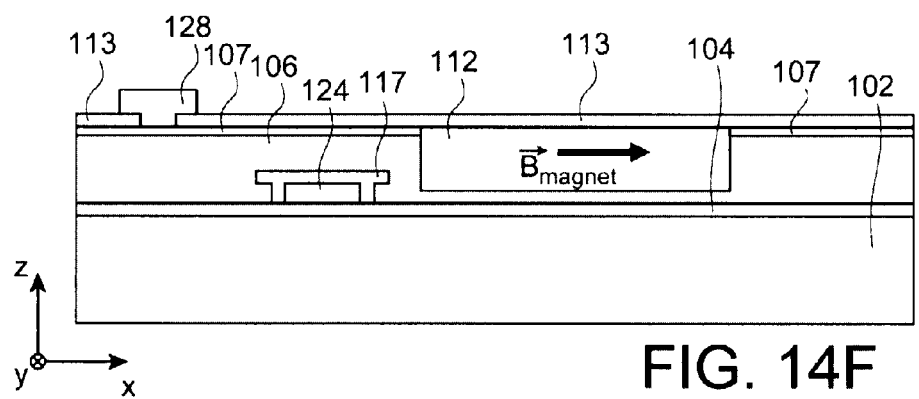

Portions of the passivation layer 113 are then etched, then the electric contacts 128 are made by depositing metal layers and etching at the portions previously etched in the passivation layer 113 (FIG. 14F).

Figure 14G:
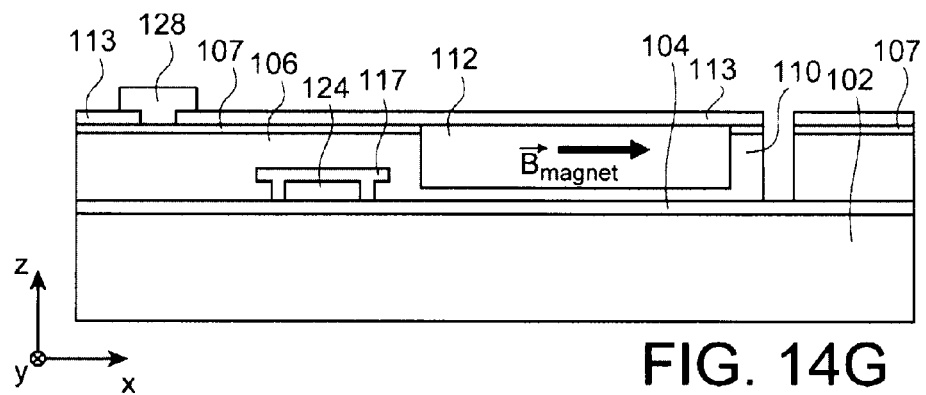

Etching is then done in the passivation layer 113 and in the epitaxied silicon layer 106 so as to delimit the box 110 as well as the hinge (not referenced) intended to mechanically connect and form the pivot link between the box 110 and the rest of the device (FIG. 14G).

Figure 14H:
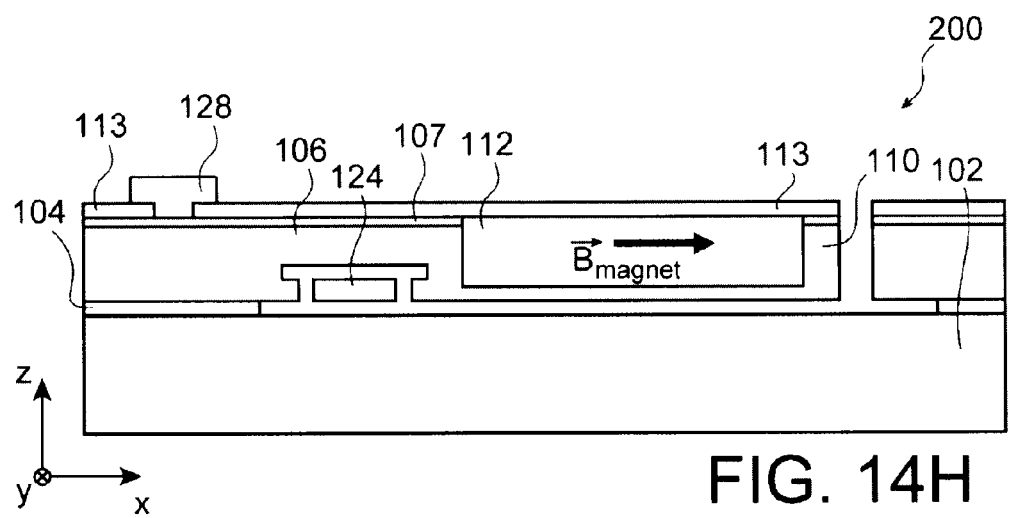

Parts of the dielectric layer 104 as well as the oxide portion 117 are then etched, for example by wet etching, in order to release the box 110, the stress gauge 124 and the hinge from the rest of the sensor 200 (FIG. 14H). It is also possible to then remove, for example by etching, the passivation layer 113.

Although the above method was described to produce the sensor 200, it may also be applied to produce the other sensors 100, 300, 400, 500 and 600 previously described.

The invention claimed is:

1. A magnetic field sensor comprising:
a body including magnetic means for forming a torque applied on the body by action of an external magnetic field to be detected;
at least one hinge that is separated from the body and configured to mechanically connect the body to an inlay portion of the sensor, the at least one hinge forming at least one pivot link having an axis perpendicular to the direction of the magnetic field to be detected; and
means for detecting a stress applied by the body by action of the torque, separated from the at least one hinge and including at least one suspended stress gauge including at least a first part mechanically connected to the inlay portion, at least a second part mechanically connected to the body, and at least a third part provided between the first and second parts and suspended between the inlay portion and the body, and not in contact with any element of the sensor,
wherein the inlay portion of the sensor is arranged on a support portion that extends beneath the body, and the at least one hinge maintains the body spaced apart from both the inlay portion and the support portion.

2. The sensor according to claim 1, wherein the suspended stress gauge is arranged outside the axis of the pivot link and/or perpendicular to the axis of the pivot link.

3. The sensor according to claim 1, wherein the magnetic means includes at least one ferromagnetic material having a direction of magnetization perpendicular to a direction of magnetic field to be detected and the axis of the pivot link, or at least one coil to be passed through by an electric current in a plane making it possible to generate an induced magnetic field with a direction perpendicular to the direction of the magnetic field to be detected.

4. The sensor according to claim 3, wherein the ferromagnetic material is a soft ferromagnetic material.

5. The sensor according to claim 4, further comprising magnetization means for the ferromagnetic material, and wherein the magnetization means is configured to form an electromagnet.

6. The sensor according to claim 1, wherein the magnetic means includes a stack of one or more layers of ferromagnetic material arranged to alternate with one or more layers of antiferromagnetic material.

7. The sensor according to claim 6, wherein each stack of layers forms a set of parallel blocks detached from each other.

8. The sensor according to claim 1, wherein the body includes a box in which the magnetic means is arranged or a face on which the magnetic means is arranged.

9. The sensor according to claim 1, wherein the body includes two main faces parallel to each other, the hinge being connected to another face of the body substantially perpendicular to the two main faces of the body.

10. The sensor according to claim 1, wherein the suspended stress gauge is of piezoresistive type and includes at least one beam composed of a semiconductor material or a metal material.

11. The sensor according to claim 10, wherein the detection means further includes means for measuring electrical resistance of the suspended stress gauge.

12. The sensor according to claim 1, wherein the suspended stress gauge is of resonator type and includes at least one vibrating beam, and the detection means further includes means for exciting the vibrating beam and means for measuring a variation in the vibration frequency of the beam.

13. The sensor according to claim 12, wherein the means for exciting the vibrating beam includes at least one voltage generator with direct and/or alternating components electrically connected to at least one excitation electrode coupled to the vibrating beam, and the means for measuring a variation in the vibration frequency of the beam includes at least one means for measuring a frequency variation of the electrical potential of at least one detection electrode coupled to the vibrating beam.

14. The sensor according to claim 1, further comprising at least one second stress gauge suspended between the inlay portion and the body, the first and second suspended stress gauges being arranged on either side of the axis of the pivot link.

15. The sensor according to claim 1, wherein at least one stress gauge is suspended between the inlay portion and the body mounted in a Wheatstone bridge.

16. The sensor according to claim 1, further comprising:
a second body comprising second magnetic means for forming a second torque applied on the second body by action of the magnetic field to be detected substantially similarly to the first body;

second connection means mechanically connecting the second body to an inlay portion of the sensor by at least one second pivot link with an axis perpendicular to the direction of the magnetic field to be detected;

second means for detecting a stress applied by the second body by action of the second torque, including at least one second stress gauge suspended between the inlay portion and the second body and configured to work differentially in compression or tension relative to the first suspended stress gauge working in tension or compression, respectively.

17. The sensor according to claim 1, wherein the body includes two parallel main faces, and includes a recess passing through the two main faces and centered relative to sections of the two main faces, the sensor further comprising:

at least two hinges to mechanically connect a wall of the body, each wall being perpendicular to the two main faces of the body and forming a side of the recess, to the inlay portion of the sensor arranged in the recess by a pivot link having an axis perpendicular to the direction of the magnetic field to be detected and perpendicular to the two main faces of the body; and at least one piezoresistive stress gauge suspended between the inlay portion of the sensor and the body.

18. The sensor according to claim 1, the sensor being of MEMS and/or NEMS type.

19. The sensor according to claim 1, wherein the body has a shape such that the center of gravity of the body is substantially close to the axis of the pivot link.

20. The sensor according to claim 1, wherein the center of gravity of the magnetic means is substantially close to the axis of the pivot link.

21. A magnetic field sensor with two or three directions respectively including two or three magnetic sensors according to claim 1, the magnetic sensors being arranged so that directions of the magnetic fields to be measured by the sensors are perpendicular to each other.

22. The magnetic field sensor according to claim 21, including three magnetic sensors, wherein the axes of the pivot links of two of the magnetic sensors are perpendicular to the axis of the pivot link of the third magnetic sensor.

23. The sensor according to claim 22, wherein each magnetic sensor includes at least one ferromagnetic material, a magnetization direction of which is perpendicular to a direction of the component of the magnetic field to be detected by the sensor and perpendicular to the axis of the pivot link of the sensor.

24. The sensor according to claim 22, wherein each magnetic sensor includes at least one ferromagnetic material having a magnetization direction perpendicular to the axis of the pivot link of said sensor, the magnetization directions of the ferromagnetic materials of the three magnetic sensors being similar, and also including at least one magnetic flux guide configured to reorient magnetic field lines in a first direction perpendicular to an initial direction of the field lines, the magnetic flux guide being coupled to one of the three magnetic sensors such that the sensor can measure the magnetic field formed by the reoriented field lines.

25. The sensor according to claim 24, further comprising at least one fourth magnetic sensor similar to the sensor to which the magnetic flux guide is coupled, the magnetic flux guide being configured to orient the magnetic field lines in a second direction perpendicular to the initial direction of the field lines and opposite to the first reorientation direction of the field lines, the magnetic flux guide also being coupled to the fourth magnetic sensor such that the fourth sensor can measure the magnetic field formed by the reoriented field lines in the second direction.

26. The sensor according to claim 24, wherein the magnetic flux guide includes at least one magnetic field lines amplification element.

27. A method of making a magnetic field sensor comprising:

making a body comprising magnetic means for forming a torque applied on the body by action of an outside magnetic field to be detected;

making at least one hinge that is separated from the body and that mechanically connects the body to an inlay portion of the sensor, the at least one hinge forming at least one pivot link having an axis perpendicular to the direction of the magnetic field to be detected; and making means for detecting a stress applied by the body by action of the torque, separated from the at least one hinge, including at least one suspended stress gauge including at least a first part mechanically connected to the inlay portion, at least one second part being mechanically connected to the body, and at least a third part arranged between the first and second parts and suspended between the inlay portion and the body and not in contact with any element of the sensor, wherein the inlay portion of the sensor is arranged on a support portion that extends beneath the body, and the at least one hinge maintains the body spaced apart from both the inlay portion and the support portion.

* * * * *